United States Patent
Chang et al.

(10) Patent No.: US 9,001,551 B2
(45) Date of Patent: *Apr. 7, 2015

(54) SEMICONDUCTOR DEVICES INCLUDING VARIABLE RESISTANCE ELEMENTS AND METHODS OF OPERATING SEMICONDUCTOR DEVICES

(75) Inventors: Man Chang, Seongnam-si (KR); Young-bae Kim, Seoul (KR); Dong-soo Lee, Gunpo-si (KR); Chang-bum Lee, Seoul (KR); Seung-ryul Lee, Seoul (KR); Chang-jung Kim, Yongin-si (KR); Myoung-jae Lee, Hwaseong-si (KR); Kyung-min Kim, Goyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 328 days.

This patent is subject to a terminal disclaimer.

(21) Appl. No.: 13/488,869

(22) Filed: Jun. 5, 2012

(65) Prior Publication Data

US 2013/0058153 A1 Mar. 7, 2013

(30) Foreign Application Priority Data

Sep. 6, 2011 (KR) .................. 10-2011-0090200

(51) Int. Cl.
*G11C 11/00* (2006.01)
*G11C 13/00* (2006.01)
*G11C 11/56* (2006.01)

(52) U.S. Cl.
CPC ........ *G11C 13/0069* (2013.01); *G11C 13/0007* (2013.01); *G11C 11/5685* (2013.01); *G11C2013/0076* (2013.01); *G11C 2013/009* (2013.01); *G11C 2013/0092* (2013.01); *G11C 2213/31* (2013.01); *G11C 2213/32* (2013.01); *G11C 2211/5625* (2013.01)

(58) Field of Classification Search
CPC ........ G11C 11/02; G11C 11/08; G11C 17/06; G11C 13/069; G11C 1/21; G11C 13/0007; G01C 17/06; G01C 17/16; G01C 13/0004
USPC ................. 365/148, 158, 163, 171, 173, 175
See application file for complete search history.

(56) References Cited

U.S. PATENT DOCUMENTS 7,646,632 B2   1/2010  Philipp et al.
8,611,131 B2 * 12/2013  Chang et al. .................. 365/148

(Continued)

FOREIGN PATENT DOCUMENTS

| EP | 2562763 A2 | 2/2013 |
| JP | 2009-026364 A | 2/2009 |
| KR | 100801082 B1 | 1/2008 |

(Continued)

OTHER PUBLICATIONS

Extended European Search Report dated Nov. 21, 2014, issued in Application No. 12178296.5.

*Primary Examiner* — Hien Nguyen
(74) *Attorney, Agent, or Firm* — Harness, Dickey & Pierce, P.L.C.

(57) ABSTRACT

In a method of operating a semiconductor device, a resistance value of a variable resistance element is changed from a first resistance value to a second resistance value by applying a first voltage to the variable resistance element; and a first current that flows through the variable resistance element is sensed. A second voltage for changing the resistance value of the variable resistance element from the second resistance value to the first resistance value is modulated based on a dispersion of the first current, and the first voltage is re-applied to the variable resistance element based on a dispersion of the first current.

25 Claims, 20 Drawing Sheets

(56) References Cited

U.S. PATENT DOCUMENTS 8,773,888 B2 * 7/2014 Chang et al. .................. 365/148
2011/0051508 A1 3/2011 Eleftheriou et al.

FOREIGN PATENT DOCUMENTS

| WO | WO-2009/051274 | | 2/2009 |
| WO | WO-2009/142828 | A1 | 11/2009 |

* cited by examiner

FIG. 14

| | RESET RESETTING (S410) | READ I_RESET (S431) | CHANGE SETTING CONDITIONS | ADDITIONAL SETTING | ADDITIONAL RESETTING (S450) |
|---|---|---|---|---|---|
| [1] I_RESET > I_RESET_1 <LOW RESISTANCE> | | FAIL | V_SET − ΔV (S437) | V_RESET (S443) | V_SET − ΔV |
| [2] I_RESET_1 > I_RESET > I_RESET_2 | V_RESET | PASS | − (S433) | − | V_SET |
| [3] I_RESET_2 > I_RESET <HIGH RESISTANCE> | | FAIL | V_SET + ΔV (S435) | V_SET + V_RESET (S445&S443) V_SET + ΔV + V_RESET | V_SET + ΔV |

FIG. 16

| | RESET RESETTING (S410) | READ I_RESET (S431) | CHANGE SETTING CONDITIONS | ADDITIONAL SETTING | ADDITIONAL RESETTING (S450) |
|---|---|---|---|---|---|
| [1] I_RESET > I_RESET_1 <LOW RESISTANCE> | V_RESET | FAIL | (S437') | V_RESET (S443) | V_SET |
| [2] I_RESET_1 > I_RESET > I_RESET_2 | | PASS | (S433) | - | V_SET |
| [3] I_RESET_2 > I_RESET <HIGH RESISTANCE> | | FAIL | V_SET + ΔV (S435) | V_SET + V_RESET (S445 & S443)  V_SET + ΔV + V_RESET | V_SET + ΔV |

SEMICONDUCTOR DEVICES INCLUDING VARIABLE RESISTANCE ELEMENTS AND METHODS OF OPERATING SEMICONDUCTOR DEVICES

CROSS-REFERENCE TO RELATED APPLICATION(S)

This application claims priority under 35 U.S.C. §119 to Korean Patent Application No. 10-2011-0090200, filed on Sep. 6, 2011, in the Korean Intellectual Property Office, the disclosure of which is incorporated herein in its entirety by reference.

BACKGROUND

1. Field

Example embodiments relate to semiconductor devices and/or methods of operating the same, for example, semiconductor devices including variable resistance elements and/or methods of operating semiconductor devices.

2. Description of the Related Art

As demands for higher capacity and lower power consuming memory devices are growing, research has been conducted into next-generation memory devices that are not only non-volatile memory devices, but also do not need to be refreshed. Such next-generation memory devices are required to have relatively high-integration characteristics of Dynamic Random Access Memory (DRAM), non-volatile characteristics of flash memory, high operating speeds of static RAM (SRAM), and the like. Examples of memory devices that have drawn attention as such next-generation memory devices are Phase Change RAM (PRAM), Nano Floating Gate Memory (NFGM), Polymer RAM (PoRAM), Magnetic RAM (MRAM), Ferroelectric RAM (FeRAM), Resistive RAM (RRAM). From among these memory devices, RRAM operates based on the principle that when an appropriately high voltage is applied to a non-conductive material, a current path is generated, thus lowering the resistance of the non-conductive material. Once the current path is generated, the path may be canceled or generated again by applying an appropriate voltage to the non-conductive material.

SUMMARY

Semiconductor devices according to at least some example embodiments may have improved reliability as a result of improved dispersion of current flowing through a variable resistance element therein. Example embodiments also provide methods of operating semiconductor devices.

Additional aspects will be set forth in part in the description which follows and, in part, will be apparent from the description, or may be learned by practice of example embodiments.

According to at least one example embodiment, a method of operating a semiconductor device includes: applying a first voltage to the variable resistance element to change a resistance value of the variable resistance element from a first resistance value to a second resistance value, wherein the first resistance value and the second resistance value are different; sensing a first current that flows through the variable resistance element to which the first voltage is applied; determining whether the first current falls within a first range and a second range; modulating a second voltage for changing the resistance value of the variable resistance element from the second resistance value to the first resistance value if the first current does not fall within the first range; and applying the first voltage again to the variable resistance element if the first current does not fall within the second range.

According to at least one other example embodiment, a method of operating a semiconductor device includes: changing a resistance value of a variable resistance element from a first resistance value to a second resistance value by applying a first voltage to the variable resistance element, wherein the first resistance value and the second resistance value are different; sensing a first current that flows through the variable resistance element; determining whether the first current falls within at least one of a first range and a second range; modulating a second voltage for changing the resistance value of the variable resistance element from the second resistance value to the first resistance value if the first current does not fall within the first range; and applying the first voltage again to the variable resistance element if the first current does not fall within the second range.

According to at least some example embodiments, the modulating of the second voltage may include changing at least one of an absolute value and a pulse width of the second voltage.

The determining of whether the first current falls within the first range may include comparing the sensed first current with an average of the first current.

The modulating of the second voltage may include increasing the second voltage when the sensed first current is lower than the average of the first current, and reducing the second voltage when the sensed first current is higher than the average of the first current.

The modulating of the second voltage may include modulating the second voltage in such a manner that the dispersion of the first current increases as the variation in the second voltage increases.

According to at least some example embodiments, the second voltage may be maintained constant or substantially constant when the first current falls within the first range.

The applying of the first voltage again may be performed when the first current is greater than a maximum value of the second range.

According to at least some example embodiments, the modulated second voltage may be applied to the variable resistance element when the first current does not fall within the second range and the first current is less than a minimum value of the second range.

According to at least some example embodiments, the modulated second voltage may be applied to the variable resistance element.

The applying of the modulated second voltage may be performed while an erase operation is performed on the variable resistance element.

The second resistance may be greater than the first resistance.

The first resistance may be a set resistance, and the second resistance may be a reset resistance.

The sensing of the first current that flows through the variable resistance element may include sensing the first current that flows through the variable resistance element by applying a read voltage, the absolute value of the read voltage being lower than the first voltage.

Before the determining of whether the first current falls within the first range, the method may further include determining whether the first current falls within a verification range that is a range of current of data corresponding to the second resistance value.

If the first current is greater than a maximum value of the verification range, the method may further include changing the first voltage.

Applying of the changed first voltage to the variable resistance element and sensing of the first current that flows through the variable resistance element may be repeatedly performed.

If the first current is less than a minimum value of the verification range, then the method may further include applying a third voltage to the variable resistance element to change a resistance value of the variable resistance element from the second resistance value to the first resistance value.

Applying of the first voltage to the variable resistance element to which the third voltage is applied and sensing of the first current that flows through the variable resistance element may be repeatedly performed after the applying of the third voltage.

At least one other example embodiment provides a method of operating a semiconductor device including: applying a first voltage to a variable resistance element to change a resistance value of the variable resistance element from a first resistance value to a second resistance value, wherein the first resistance value and the second resistance value are different; sensing first current that flows through the variable resistance element; modulating a second voltage for changing the resistance value of the variable resistance element from the second resistance value to the first resistance value based on a dispersion of the first current; and applying the first voltage again to the variable resistance element based on a dispersion of the first current.

At least one other example embodiment provides a method of operating a semiconductor device including: applying a first voltage to the variable resistance element to change a resistance value of the variable resistance element from a first resistance value to a second resistance value, wherein the first resistance value and the second resistance value are different; sensing first current that flows through the variable resistance element; determining whether the first current falls within a dispersion range; increasing a second voltage for changing the resistance value of the variable resistance element from the second resistance value to the first resistance value if the first current does not fall within the dispersion range and is less than a minimum value of the dispersion range; and applying the first voltage again to the variable resistance element if the first current does not fall within the dispersion range and is greater than a maximum value of the dispersion range.

According to at least some example embodiments, the increased second voltage may be applied to the variable resistance element.

According to at least some example embodiments, the first voltage may be applied to the variable resistance element to which the increased second voltage is applied.

At least one example embodiment provides a semiconductor device including: a variable resistance element, a resistance value of which is changed from a first resistance value to a second resistance value when a first voltage is applied thereto, and is changed from the second resistance value to the first resistance value when a second voltage is applied thereto, wherein the first resistance value and the second resistance value are different; a selector connected in series with the variable resistance element; and a controller configured to control the selectors to apply a voltage to the variable resistance element. The first voltage is applied to the variable resistance element, and whether first current that flows through the variable resistance element falls within a first range and a second range is determined. If the first current does not fall within the first range, then a second voltage is modulated to change the resistance value of the variable resistance element from the second resistance value to the first resistance value. If the first current does not fall within the second range, then the first voltage is applied again to the variable resistance element.

At least one other example embodiment provides a semiconductor device including: a variable resistance element configured to transition between a first resistance value and a second resistance value based on an applied voltage, the applied voltage being one of a first voltage and a second voltage, and the first resistance value and the second resistance value being different; a selector connected in series with the variable resistance element; and a controller configured to control the selector to selectively apply the voltage to the variable resistance element; wherein if a first current does not fall within a first range in response to a read voltage, then the second voltage is modulated to change the resistance value of the variable resistance element from the second resistance value to the first resistance value, and if the first current does not fall within a second range in response to the read voltage, then the first voltage is re-applied to the variable resistance element.

BRIEF DESCRIPTION OF THE DRAWINGS

These and/or other aspects will become apparent and more readily appreciated from the following description of example embodiments shown in the drawings in which:

FIG. 14 is a table illustrating example operations that are repeatedly performed according to the method of FIG. 13;

FIG. 16 is a table illustrating example operations that are repeatedly performed according to the method of FIG. 15;

DETAILED DESCRIPTION

Figure 1:
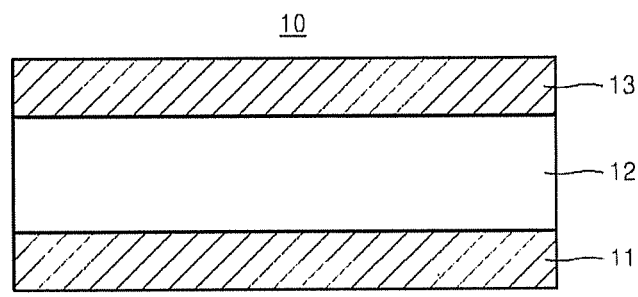
FIG. 1 is a schematic cross-sectional view of a variable resistance element according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

FIG. 1 is a schematic cross-sectional view of a variable resistance element 10 according to an example embodiment.

Referring to FIG. 1, the variable resistance element 10 includes a lower electrode 11, a variable resistance material layer 12, and an upper electrode 13. The variable resistance material layer 12 is (e.g., disposed) between the lower electrode 11 and the upper electrode 13. According to at least one other example embodiment, the variable resistance element 10 may further include a buffer layer (not shown) on either the lower electrode 11 or the variable resistance material layer 12.

The lower electrode 11 and the upper electrode 13 may each include a conductive material, for example, an oxidation resistant metal layer or a poly silicon layer. For example, the oxidation resistant metal layer may include at least one of platinum (Pt), iridium (Ir), an iridium oxide (IrO), a titanium nitride (TiN), a titanium aluminum nitride (TiAlN), tungsten (W), molybdenum (Mo), ruthenium (Ru), and a ruthenium oxide (RuO). The oxidation resistant metal layer may be formed after the buffer layer is formed. According to at least this example embodiment, the lower electrode 11 and the upper electrode 13 are respectively disposed below and above the variable resistance material layer 12, but example embodiments are not limited thereto. According to at least one other example embodiment, the lower electrode 11 and the upper electrode 13 may be disposed at left and right sides, respectively, of the variable resistance material layer 12.

The variable resistance material layer 12 may include a Perovskite-based oxide or a transition metal oxide. Examples of the Perovskite-based oxide include $Pr_{1-x}Ca_xMnO_3$, $La_{1-x}Ca_xMnO_3$, $SrZrO_3/SrTiO_3$, $CrTiO_3$, and $Pb(Zr, Ti)O_3/Zn_{1-x}Cd_xS$. Examples of a transition metal include nickel, niobium, titanium, zirconium, hafnium, cobalt, iron, copper, manganese, zinc, and chrome. A resistance value of the variable resistance material layer 12 may vary according to a voltage between the lower electrode 11 and the upper electrode 13.

Figure 2:
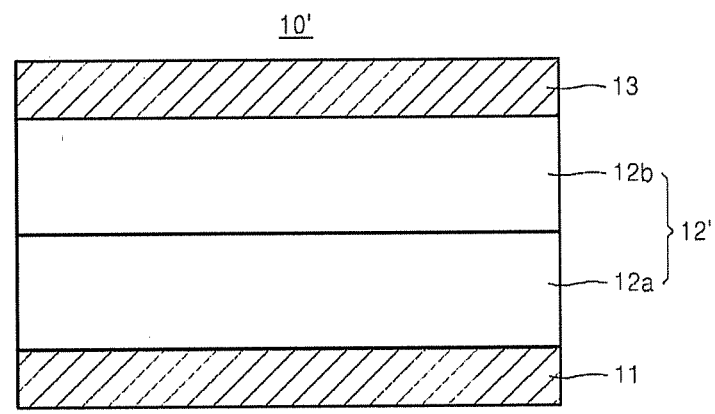
FIG. 2 is a schematic cross-sectional view of a variable resistance element according to another example embodiment.

FIG. 2 is a schematic cross-sectional view of a variable resistance element 10' according to another example embodiment.

Referring to FIG. 2, the variable resistance element 10' includes a lower electrode 11, a variable resistance material layer 12', and an upper electrode 13. The variable resistance material layer 12' is (e.g., disposed) between the lower electrode 11 and the upper electrode 13. In at least this example embodiment, the variable resistance material layer 12' includes a base thin film 12a and an oxygen exchange layer 12b. For example, the base thin film 12a may include $TaO_x$, and the oxygen exchange layer 12b may include $Ta_2O_5$. The variable resistance element 10' according to at least this example embodiment is similar to the variable resistance element 10 illustrated in FIG. 1. Thus, the description with reference to FIG. 1 may also apply to this example embodiment.

Figure 3:
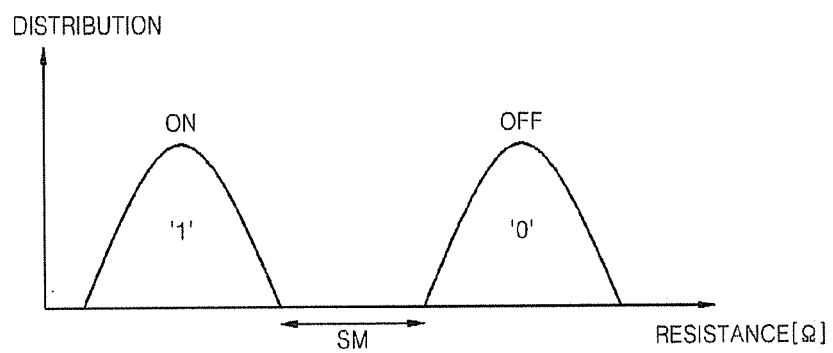
FIG. 3 is a graph schematically showing an example distribution of resistance values of a variable resistance element according to an example embodiment when the variable resistance element is included in a single-bit memory device.

FIG. 3 is a graph schematically showing a distribution of resistance values of a variable resistance element according to an example embodiment when the variable resistance element is included in a single-bit memory device.

Referring to FIG. 3, the X-axis denotes a resistance value of the single-bit memory device including the variable resistance element, and the Y-axis denotes the number of single-bit memory cells. The variable resistance element 10 of FIG. 1 or the variable resistance element 10' of FIG. 2 may be used in a semiconductor device, such as a single-bit non-volatile memory device, which stores data '0' or '1' according to a resistance state of the variable resistance material layer 12.

In at least this example embodiment, data '1' corresponds to a low resistance state (e.g., a set resistance state), and data '0' corresponds to a high resistance state (e.g., a reset resistance state). In this example, writing data '1' to the variable resistance element 10 is referred to as a setting operation, whereas writing data '0' to the variable resistance element 10 is referred to as a resetting operation. However, example embodiments are not limited thereto. According to at least one other example embodiment, data '1' may correspond to the high resistance state, and data '0' may correspond to the low resistance state. It is hereinafter assumed that a set resistance value that is a low resistance value is a first resistance value, and a reset resistance value that is a high resistance value is a second resistance value.

The single-bit non-volatile memory device is in an 'ON' state when data '1' is written to the single-bit non-volatile memory device, but in an 'OFF' state when data '0' is written to the single-bit non-volatile memory device. In this case, to improve the reliability of the single-bit non-volatile memory device, a sufficient sensing margin SM should be present (e.g., secured) between the 'ON' state and the 'OFF' state of the single-bit non-volatile memory device.

Figure 4:
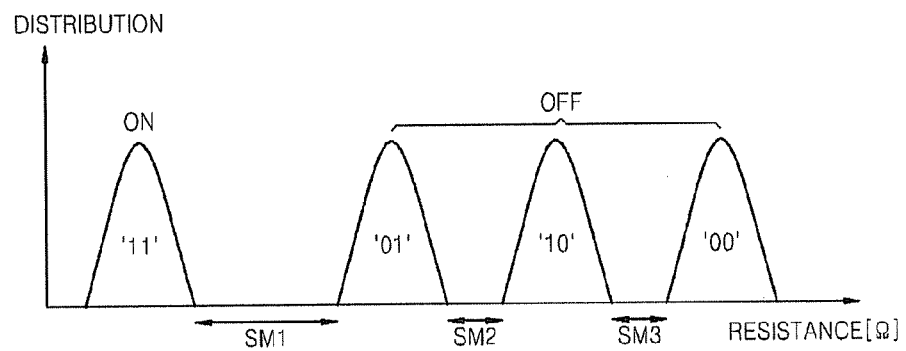
FIG. 4 is a graph schematically showing an example distribution of resistance values of a variable resistance element according to an example embodiment when the variable resistance element is included in a multi-bit memory device.

FIG. 4 is a graph schematically showing a distribution of resistance values of a variable resistance element according to an example embodiment when the variable resistance element is included in a multi-bit memory device. In FIG. 4, the X-axis denotes a resistance value of the multi-bit memory device including the variable resistance element, and the Y-axis denotes the number of multi-bit memory cells. The variable resistance element 10 of FIG. 1 or the variable resistance element 10' of FIG. 2 may be used in a semiconductor device, such as a multi-bit non-volatile memory device configured to store multi-bit data '00', '01', '10', or '11' according to a resistance state of the variable resistance material layer 12.

In at least this example embodiment, data '11' corresponds to a low resistance state, whereas data '01', '10', and '00' correspond to a high resistance state. In this example, writing data '11' to the variable resistance element 10 is referred to as a setting operation, whereas writing data '01', '10', and '00' to the variable resistance element 10 is referred to as a resetting operation. Example embodiments, however, are not limited thereto. According to at least some example embodiments, data '11' may correspond to the high resistance state, whereas data '01', '10', and '00' may correspond to the low resistance state.

According to at least this example embodiment, the multi-bit non-volatile memory device is in an 'ON' state when data '11' is written to the multi-bit non-volatile memory device, but in an 'OFF' state when data '01', '10', or '00' is written to the multi-bit non-volatile memory device. In this case, in order to improve the reliability of the multi-bit non-volatile memory device, a sufficient sensing margin SM1 should be present (e.g., secured) between the 'ON' state and the 'OFF' state of the multi-bit non-volatile memory device. Furthermore, data '01', '10', and '00' may correspond to the 'OFF' state. Thus, sufficient sensing margins SM2 and SM3 should present (e.g., secured) between data '01', '10', and '00'.

The variable resistance element 10 of FIG. 1 or the variable resistance element 10' of FIG. 2 may be used in a semiconductor device, such as a 3-bit non-volatile memory device configured to store multi-bit data '000', '001', '010', '011', '100', '101', '110', or '111' according to a resistance state of the variable resistance material layer 12. Furthermore, the variable resistance element 10 of FIG. 1 or the variable resistance element 10' of FIG. 2 may be used in a semiconductor device, such as a 4-bit or higher non-volatile memory device material according to a resistance state of the variable resistance material layer 12.

Figure 5:
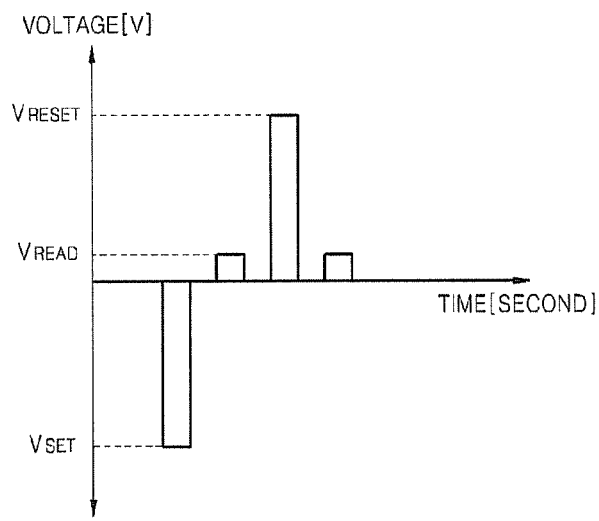
FIG. 5 is a graph showing examples of operating voltages applied to the variable resistance element of FIG. 1, according to an example embodiment.

FIG. 5 is a graph showing example operating voltages applied to the variable resistance element 10 of FIG. 1 according to an example embodiment. In FIG. 5, the X-axis denotes time in seconds, and the Y-axis denotes a voltage applied to the variable resistance element 10 in volts (V). Here, the voltage applied to the variable resistance element 10 is the difference between a voltage applied to the upper electrode 13 and a voltage applied to the lower electrode 11. More particularly, for example, the voltage applied to the variable resistance element 10 may be a voltage of the upper electrode 13 when a voltage of the lower electrode 11 is a reference voltage.

In at least one example embodiment, a set voltage $V_{SET}$ may be applied to the variable resistance element 10, then a read voltage $V_{READ}$ may be applied to the variable resistance element 10 to sense current that flows through the variable resistance element 10. A time period in which the set voltage $V_{SET}$ and the read voltage $V_{READ}$ are applied (e.g., continuously applied) to the variable resistance element 10 may be referred to as a set cycle.

When the set voltage $V_{SET}$ is applied to the variable resistance element 10, the variable resistance element 10 may be changed from a high resistance state to a low resistance state, thereby causing current to flow through the variable resistance element 10.

A reset voltage $V_{RESET}$ may be applied to the variable resistance element 10 followed by application of a read voltage $V_{READ}$ to sense current that flows through the variable resistance element 10. A time period in which the reset voltage $V_{RESET}$ and the read voltage $V_{READ}$ are applied (e.g., continuously applied) to the variable resistance element 10 may be referred to as a reset cycle. When the reset voltage $V_{RESET}$ is applied to the variable resistance element 10, the variable resistance element 10 may be changed from the low resistance state to the high resistance state. In the high resistance state, little current flows (e.g., current may hardly flow) through the variable resistance element 10.

In at least this example embodiment, the set voltage $V_{SET}$ and the reset voltage $V_{RESET}$ may have different polarities. The variable resistance element 10, the set voltage $V_{SET}$ and the reset voltage $V_{RESET}$ of which have different polarities is referred to as a bipolar variable resistance element.

In the graph of FIG. 5, the set voltage $V_{SET}$ and the reset voltage $V_{RESET}$ of the variable resistance element 10 respectively have a negative value and a positive value, but example embodiments are not limited thereto. According to at least some example embodiments, the set voltage $V_{SET}$ may have a positive value and the reset voltage $V_{RESET}$ may have a negative value, based on a material used to form the variable resistance material layer 12 of the variable resistance element 10. Moreover, although discussed herein with regard to a bipolar variable resistance element, example embodiments may also be implemented in conjunction with unipolar variable resistance elements in which both the set voltage $V_{SET}$ and the reset voltage $V_{RESET}$ have the same polarity (e.g., positive or negative).

A time period that the set voltage $V_{SET}$ and the reset voltage $V_{RESET}$ are applied to variable resistance element 10 may be between about 1 μs and about 1 ns, inclusive. The set voltage $V_{SET}$ and the reset voltage $V_{RESET}$ applied may have any of various pulse shapes, for example, a rectangular shape, a sawtooth shape, a trapezoid shape, and the like.

Although not shown, if the variable resistance element 10 is included in a multi-bit non-volatile memory device, then different first to third reset voltages may be applied to the multi-bit non-volatile memory device so as to write different data corresponding to an 'OFF' state to the multi-bit non-volatile memory device. For example, the third reset voltage for writing data '00' may be higher than the second reset voltage for writing data '10', and the second reset voltage may be higher than the first reset voltage for writing data '01'.

Figure 6:
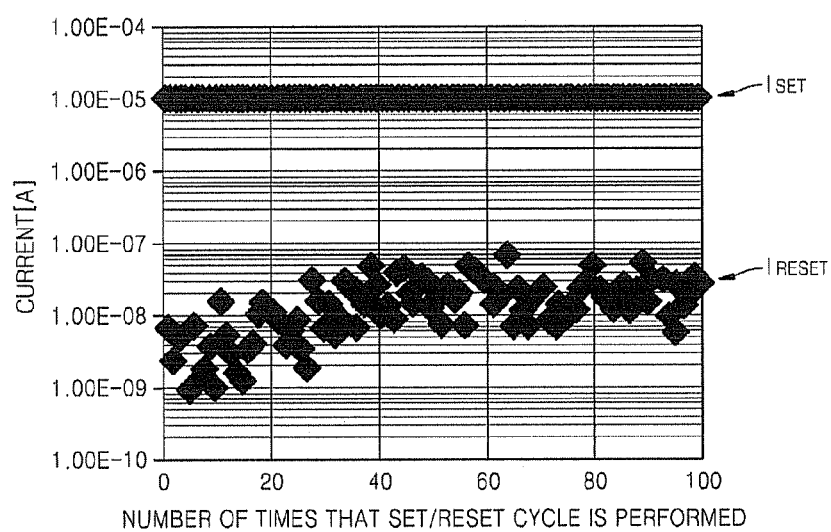
FIG. 6 is a graph showing current flowing through a variable resistance element when each of the operating voltages of FIG. 5 is applied thereto.

FIG. 6 is a graph showing current that flows through a variable resistance element when each of the operating voltages of FIG. 5 is applied thereto. In FIG. 6, the X-axis denotes the number of times that the set cycle or the reset cycle is performed, and the Y-axis denotes current in amperes (A). Current that flows through the variable resistance element 10 of FIG. 1 after the set cycle (e.g., current sensed by sequentially applying a set voltage $V_{SET}$ and a read voltage $V_{READ}$ to the variable resistance element 10) is referred to as set current $I_{SET}$. Current that flows through the variable resistance element 10 after the reset cycle (e.g., current sensed by sequentially applying a reset voltage $V_{RESET}$ and the read voltage $V_{READ}$ to the variable resistance element 10) is referred as reset current $I_{RESET}$.

Referring to FIG. 6, the set current $I_{SET}$ is maintained constant or substantially constant at about 1.00E-5 A regardless (or independent) of the number of times that the set cycle is performed. On the other hand, the reset current $I_{RESET}$ has a relatively large dispersion, and ranges from between about 1.00E-9 and about 1.00E-7, inclusive. In this example, the reset current $I_{RESET}$ has a non-linear distribution regardless (or independent) of the number of times that the reset cycle is performed.

As described above, in the variable resistance element 10, the set current $I_{SET}$ has a relatively small dispersion and the reset current $I_{RESET}$ has a relatively large dispersion. Thus, if a sufficient sensing margin is not secured between an 'ON' state and an 'OFF' state of the variable resistance element 10, then using the variable resistance element 10 in a memory device is relatively difficult. For example, when the variable resistance element 10 is included in a multi-bit non-volatile memory device, a plurality of pieces of data corresponding to the 'OFF' state should be distinguished from one another. If a sufficient sensing margin is not secured between the plurality of pieces of data, then the reliability of the multi-bit non-volatile memory device is reduced (e.g., greatly reduced).

Figure 7:
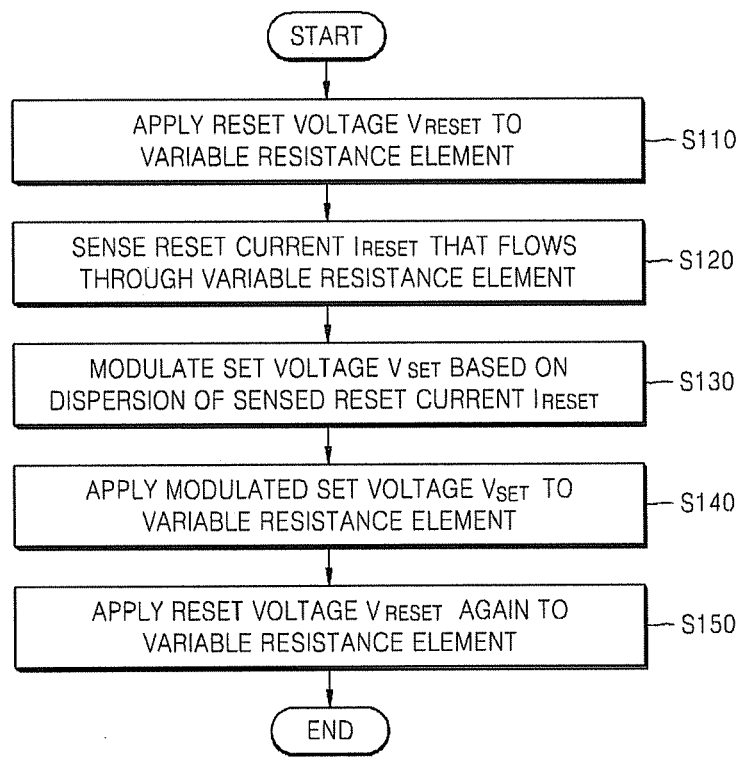
FIG. 7 is a flowchart schematically illustrating an example embodiment of a method of operating a semiconductor device based on a set voltage modulation method.

FIG. 7 is a flow chart schematically illustrating a method of operating a semiconductor device based on a set voltage modulation method according to an example embodiment. The method of FIG. 7 may be a method of operating a semiconductor device including, for example, the variable resistance element 10 of FIG. 1 or the variable resistance element 10' of FIG. 2, and may improve the reliability of the semiconductor device. The method of FIG. 7 according to at least this example embodiment will now be described with respect to the variable resistance element 10 of FIG. 1.

Referring to FIG. 7, at S110 a reset voltage $V_{RESET}$ is applied to the variable resistance element 10 to change the variable resistance element 10 from a low resistance state to a high resistance state. In other words, the variable resistance element 10 is changed from an 'ON' state to an 'OFF' state by applying the reset voltage $V_{RESET}$. In one example, the reset voltage $V_{RESET}$ may be about 4.5 V.

At S120, the reset current $I_{RESET}$ that flows through the variable resistance element 10 in the 'OFF' state is sensed. The reset current $I_{RESET}$ that flows through the variable resistance element 10 may be sensed by applying a read voltage $V_{READ}$ to the variable resistance element 10. The absolute value of the read voltage $V_{READ}$ is less than that of the reset voltage $V_{RESET}$.

At S130, a set voltage $V_{SET}$ to be applied to the variable resistance element 10 is modulated based on a dispersion of the reset current $I_{RESET}$ sensed at S120. More specifically, an absolute value or a pulse width of the set voltage $V_{SET}$ may be modulated based on the dispersion of the sensed reset current $I_{RESET}$ (e.g., a dispersion of an OFF resistance value $R_{OFF}$ of the variable resistance element 10).

During the modulating of the set voltage $V_{SET}$ at S130, at least one of the absolute value and the pulse width of the set voltage $V_{SET}$ may be modulated. In this case, a variation in the set voltage $V_{SET}$ may be modulated in such a manner that the greater a dispersion of the sensed reset current $I_{RESET}$, the greater a variation in the set voltage $V_{SET}$.

At S140, the modulated set voltage $V_{SET}$ is applied to the variable resistance element 10 to change the variable resistance element 10 from a high resistance state to a low resistance state. In other words, the variable resistance element 10 is changed from an 'OFF' state to an 'ON' state.

The method of FIG. 7 may further include sensing the set current $I_{SET}$ that flows through the variable resistance element 10 in the 'ON' state. More specifically, the sensing set current $I_{SET}$ that flows through the variable resistance element 10 in the 'ON' state is applied may be sensed by applying a read voltage $V_{READ}$ to the variable resistance element 10. The absolute value of the read voltage $V_{READ}$ is less than that of the set voltage $V_{SET}$.

At S150, the reset voltage $V_{RESET}$ is applied again to the variable resistance element 10. The variable resistance element 10 may have a relatively uniform distribution of energy by applying the reset voltage $V_{RESET}$ again to the variable resistance element 10 after applying the modulated set voltage $V_{SET}$ thereto. When the variable resistance element 10 is changed to the 'OFF' state by applying the reset voltage $V_{RESET}$ thereto, a dispersion of an 'OFF' resistance value $R_{OFF}$ of the variable resistance element 10 may be reduced (e.g., greatly reduced).

Figure 8:
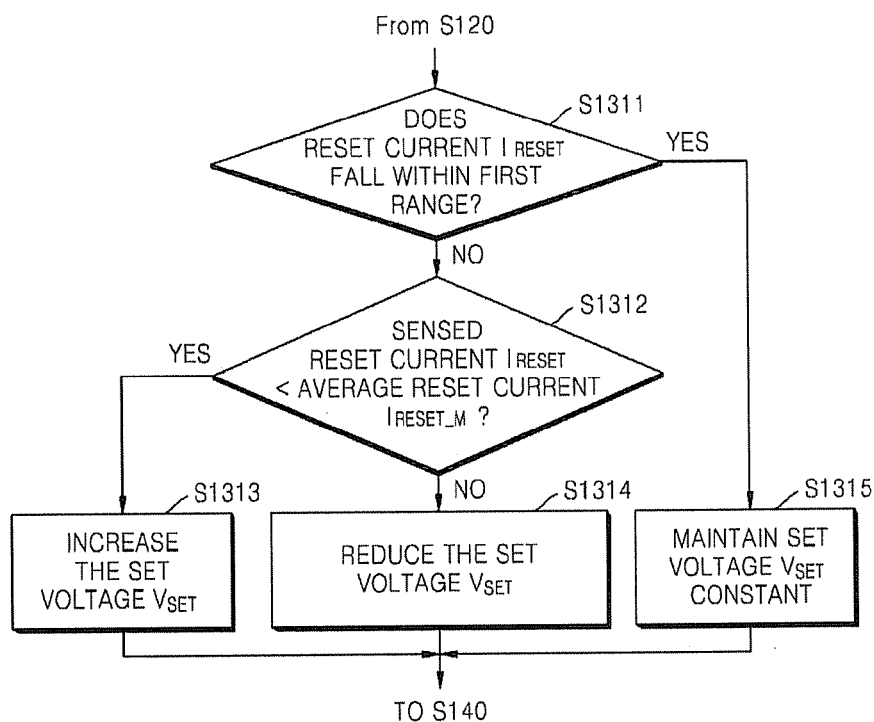
FIG. 8 is a flowchart specifically illustrating an example embodiment of a method for modulating a set voltage.

FIG. 8 is a flowchart illustrating an example embodiment of S130 shown in FIG. 7.

Referring to FIG. 8, in the modulating of the set voltage $V_{SET}$, at S1311 it is determined whether the reset current $I_{RESET}$ falls within a first range. The first range may be narrower when the reliability of the semiconductor device needs to be improved.

If the reset current $I_{RESET}$ falls within the first range, then the set voltage $V_{SET}$ is maintained constant or substantially constant at S1315. That is, for example, when the reset current $I_{RESET}$ falls within the first range, the semiconductor device is determined to be reliable, and thus, the set voltage $V_{SET}$ is maintained constant or substantially constant at S1315.

Returning to S1311, if the reset current $I_{RESET}$ does not fall within the first range, then it is determined whether the sensed reset current $I_{RESET}$ is less than an average reset current $I_{RESET\_M}$ at S1312.

If the sensed reset current $I_{RESET}$ is less than the average reset current $I_{RESET\_M}$, then the set voltage $V_{SET}$ is increased at S1313. In other words, when the sensed reset current $I_{RESET}$ is less than the average reset current $I_{RESET\_M}$, a level of energy needed to change the variable resistance element 10 from an 'OFF' state to an 'ON' state is relatively high (e.g., an undershoot state), and thus, the set voltage $V_{SET}$ is increased.

Returning to S1312, if the sensed reset current $I_{RESET}$ is greater than the average reset current $I_{RESET\_M}$, then the set voltage $V_{SET}$ is reduced at S1314. In other words, when the sensed reset current $I_{RESET}$ is greater than the average reset current $I_{RESET\_M}$, the level of energy needed to change the variable resistance element 10 from the 'OFF' state to the 'ON' state is relatively low (e.g., an overshoot state), and thus, the set voltage $V_{SET}$ is reduced.

As described above with respect to S1313 and S1314, the level of energy of the variable resistance element 10 may be controlled to have a relatively uniform distribution by increasing or reducing the set voltage $V_{SET}$ according to a dispersion of the reset current $I_{RESET}$, when the variable resistance element 10 is in the 'ON' state.

Figure 9:
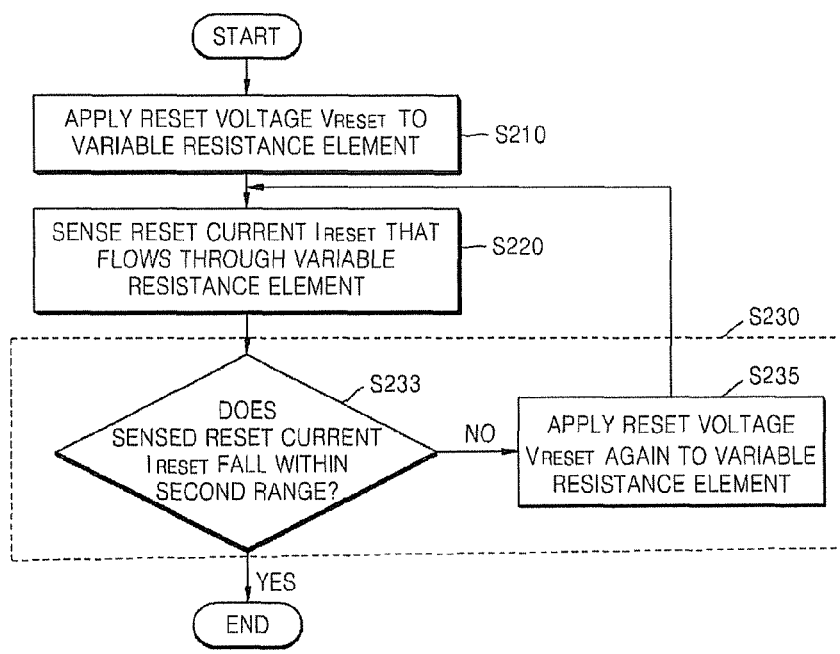
FIG. 9 is a flowchart schematically illustrating an example embodiment of a method of operating a semiconductor device based on a constant step pulse program (CSPP) method.

FIG. 9 is a flowchart schematically illustrating a method of operating a semiconductor device based on a constant step pulse program (CSPP) method according to another example embodiment. The method of FIG. 9 may be a method of operating a semiconductor device including, for example, the variable resistance element 10 of FIG. 1 or the variable resistance element 10' of FIG. 2. And, the method shown in FIG. 9 may improve reliability of a semiconductor device. The method of FIG. 9 according to at least this example embodiment will now be described with respect to the variable resistance element 10 of FIG. 1.

In this example embodiment, at S210 a reset voltage $V_{RESET}$ is applied to the variable resistance element 10 to change the variable resistance element 10 from a low resistance state to a high resistance state. In other words, the variable resistance element 10 is changed from an 'ON' state to an 'OFF' state.

When the variable resistance element 10 is used in a multi-bit non-volatile memory device, first to third reset voltages may be applied to the variable resistance element 10 to write different data '01', '10', and '00' to the variable resistance element 10. In this example, the first reset voltage for writing data '01' to the multi-bit non-volatile memory device may be about 4.3 V, the second reset voltage for writing data '10' to the multi-bit non-volatile memory device may be about 4.5 V, and the third reset voltage for writing data '00' to the multi-bit non-volatile memory device may be about 4.7 V.

Referring back to FIG. 9, at S220 the reset current $I_{RESET}$ that flows through the variable resistance element 10 in the 'OFF' state is sensed. More specifically, the reset current $I_{RESET}$ that flows through the variable resistance element 10 may be sensed by applying read voltage $V_{READ}$ to the variable resistance element 10. The absolute value of the read voltage $V_{READ}$ is less than that of the reset voltage $V_{RESET}$. In one example, the read voltage $V_{READ}$ may be lower than the reset voltage $V_{RESET}$ and the set voltage $V_{SET}$, and may be about 0.5 V.

At S230, a CSPP operation of applying the reset voltage $V_{RESET}$ again to the variable resistance element 10 based on a dispersion of the reset current $I_{RESET}$ sensed at S220.

More specifically, at S233 it is determined whether the sensed reset current $I_{RESET}$ falls within a second range. If the sensed reset current $I_{RESET}$ falls within the second range at S233, then the method of FIG. 9 ends.

Returning to S233, if the sensed reset current $I_{RESET}$ does not fall within the second range, then the reset voltage $V_{RESET}$ is applied again to the variable resistance element 10 at 3235. For example, the reset voltage $V_{RESET}$ applied again to the variable resistance element 10 may be equal or substantially equal to and/or may have the same or substantially the same pulse width as the reset voltage $V_{RESET}$ previously applied to the variable resistance element 10. Here, the second range may be given, desired or predetermined to secure a sufficient sensing margin between 'ON' current and 'OFF' current of the variable resistance element 10. The second range may be determined to be relatively narrow when the reliability of the semiconductor device needs to be improved.

After re-applying the reset voltage $V_{RESET}$ at S235, the reset current $I_{RESET}$ that flows through the variable resistance element 10 is sensed again at S220, and the CSPP operation is repeated as discussed above. In the example embodiment shown in FIG. 9, operations S220 and S230 may be repeated until the reset current $I_{RESET}$ that flows through the variable resistance element 10 falls within the second range. Accordingly, a dispersion of 'OFF' current of the semiconductor device may be improved, which may improve the reliability of the semiconductor device.

Figure 10:
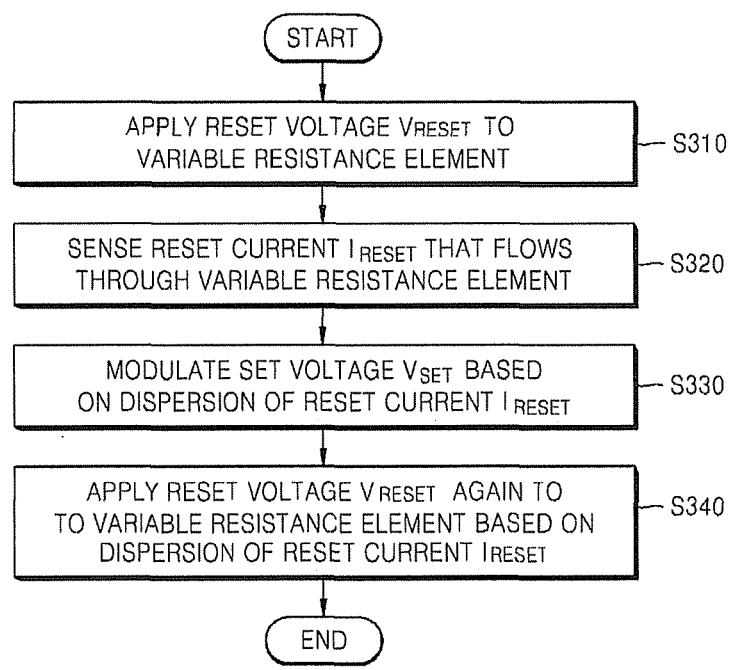
FIGS. 10 and 11 are flowcharts schematically illustrating example embodiments of methods of operating semiconductor devices based on the set voltage modulation method and the CSPP method.
Figure 11:
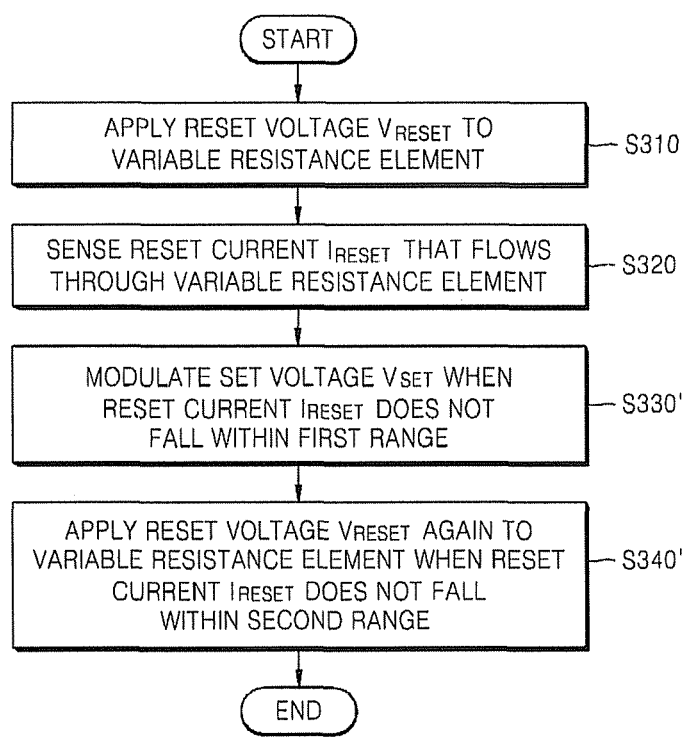

FIGS. 10 and 11 are flowcharts schematically illustrating methods of operating a semiconductor device based on the set voltage modulation method and the CSPP method, according to other example embodiments. The methods of FIGS. 10 and 11 may be similar to the methods of FIGS. 7 and 8. Parts of the methods of FIGS. 10 and 11 that are the same or substantially the same as those of the methods of FIGS. 7 and 8 will not be described here again.

Referring to FIG. 10, at S310 a reset voltage $V_{RESET}$ is applied to a variable resistance element. A reset current $I_{RESET}$ that flows through the variable resistance element is then sensed at S320.

At S330, a set voltage $V_{SET}$ that is to be applied to the variable resistance element is modulated based on a dispersion of the reset current $I_{RESET}$ sensed at S320. At S340, the reset voltage $V_{RESET}$ is applied again to the variable resistance element based on a dispersion of the reset current $I_{RESET}$.

The method of FIG. 11 is similar to the example embodiment shown in FIG. 10, except with regard to the modulating of the set voltage $V_{SET}$ at S330 and the re-application of the reset voltage at S340.

In the method of FIG. 11, the modulating of the set voltage $V_{SET}$ may be performed when an 'OFF' resistance value $R_{OFF}$ of a variable resistance element does not fall within a first range, as described above with reference to FIGS. 7 and 8. That is, for example, when reset current $I_{RESET}$ does not fall within the first range, the set voltage $V_{SET}$ is modulated at S330'.

In the modulating of the set voltage $V_{SET}$ at S330', the set voltage $V_{SET}$ is adjusted (e.g., reduced or increased) to suppress and/or prevent an energy level of the variable resistance element from being in the overshoot or undershoot state, which is caused when the sensed reset current $I_{RESET}$ is greater than a maximum value in the first range or is less than a minimum value in the first range. When the variable resistance element is changed to an 'ON' state by modulating the set voltage $V_{SET}$ at S330', it is possible to suppress and/or prevent an energy level of the variable resistance element from being excessively high or low, which may improve the reliability of the semiconductor device.

In the method of FIG. 11, at S340' the reset voltage $V_{RESET}$ is applied again if the 'OFF' resistance value $R_{OFF}$ of the variable resistance element does not fall within a second range, as described above with reference to FIG. 9. That is, for example, at S340' the reset voltage $V_{RESET}$ is applied again to the variable resistance element when the reset current $I_{RESET}$ does not fall within the second range.

More specifically, when the sensed reset current $I_{RESET}$ falls outside the second range, the reset voltage $V_{RESET}$ is applied again to the variable resistance element to reduce an amount of reset current $I_{RESET}$ that flows through the variable resistance element, and improve a dispersion of 'OFF' current of the semiconductor device. Although not shown in FIG. 11, the applying of the reset voltage $V_{RESET}$ again at S340' may be repeatedly performed until the reset current $I_{RESET}$ that flows through the variable resistance element falls within the second range, as described above with reference to FIG. 9. Accordingly, the reliability of the semiconductor device may be improved.

Figure 12:
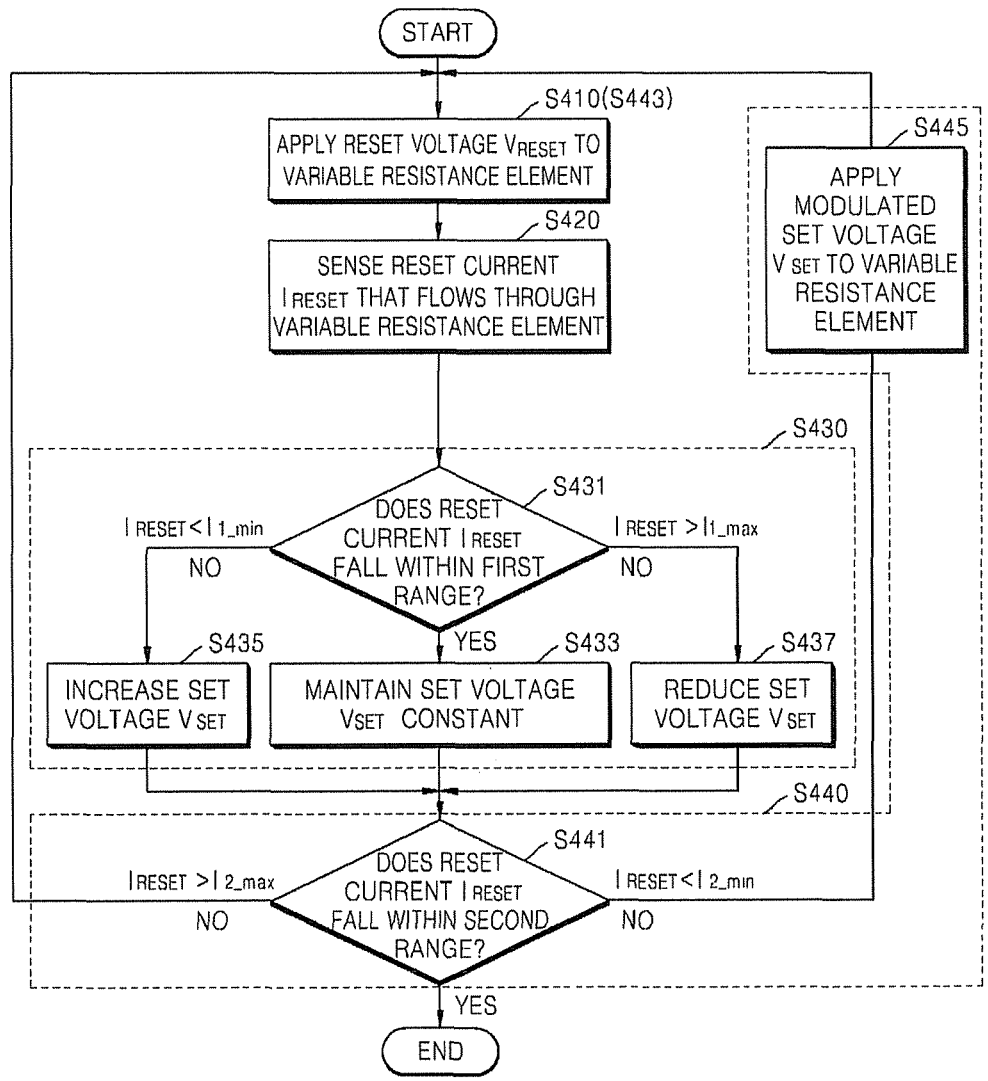
FIG. 12 is a flowchart schematically illustrating an example embodiment of a method of operating a semiconductor device based on the set voltage modulation method and the CSPP method.

FIG. 12 is a flowchart schematically illustrating a method of operating a semiconductor device based on the set voltage modulation method and the CSPP method, according to another example embodiment. The method of FIG. 12 may be similar to the method of FIG. 11. Parts of the method of FIG. 12 that are the same or substantially the same as those of the method of FIG. 11 will not be described in detail again here. For example purposes, the method shown in FIG. 12 will be described with regard to the variable resistance element shown in FIG. 1.

Referring to FIG. 12, at S410 a reset voltage $V_{RESET}$ is applied to the variable resistance element 10 of FIG. 1. At S420, a reset current $I_{RESET}$ that flows through the variable resistance element 10 is sensed.

At S430, a set voltage $V_{SET}$ that is to be applied to the variable resistance element 10 is modulated based on a dispersion of the reset current $I_{RESET}$. Then, at S440 the reset voltage $V_{RESET}$ is applied again to the variable resistance element 10 based on a dispersion of the reset current $I_{RESET}$.

More specifically with regard to S430, in the modulating of the set voltage $V_{SET}$, at S431 it is determined whether the reset current $I_{RESET}$ falls within a first range. To this end, the sensed reset current $I_{RESET}$ may be compared with an average reset current. For example, it may be determined that the reset current $I_{RESET}$ falls within the first range when the difference between the sensed reset current $I_{RESET}$ and the average reset current is less than or equal to a first dispersion value $\sigma_1$. It may be determined that the reset current $I_{RESET}$ does not fall within the first range when the difference between the sensed reset current $I_{RESET}$ and the average reset current is greater than the first dispersion value $\sigma_1$.

When the reset current $I_{RESET}$ falls within the first range, the set voltage $V_{SET}$ is maintained constant or substantially constant at S433.

Returning to S431, when the reset current $I_{RESET}$ does not fall within the first range, it is determined whether the reset current $I_{RESET}$ is greater than a maximum value $I_{1\_MAX}$ of the first range or less than a minimum value $I_{1\_MIN}$ of the first range.

When the reset current $I_{RESET}$ is greater than the maximum value $I_{1\_MAX}$ of the first range, the set voltage $V_{SET}$ is reduced at S437.

When the reset current $I_{RESET}$ is less than the minimum value $I_{1\_MIN}$ of the first range, the set voltage $V_{SET}$ is increased at S435.

The process then proceeds to step S440.

According to at least some alternative example embodiments, operations S435 and S437 may be performed based on whether the sensed reset current $I_{RESET}$ is greater than the average reset current. That is, for example, if the sensed reset current $I_{RESET}$ is greater than the average reset current, then the reducing of the set voltage $V_{SET}$ at S437 may be performed. If the sensed reset current $I_{RESET}$ is less than the average reset current, then the increasing of the set voltage $V_{SET}$ at S435 may be performed.

Still referring to FIG. 12, in the applying of the reset voltage $V_{RESET}$ again at S440, it is determined whether the reset current $I_{RESET}$ falls within a second range at S441. To this end, the sensed reset current $I_{RESET}$ may be compared with the average reset current. For example, if the difference between the sensed reset current $I_{RESET}$ and the average reset current is less than or equal to a second dispersion value $\sigma_2$, then the reset current $I_{RESET}$ is determined to fall within the second range. Otherwise, if the difference between the sensed reset current $I_{RESET}$ and the average reset current is greater than the second dispersion value $\sigma_2$, then the reset current $I_{RESET}$ is determined to fall outside the second range.

If the reset current $I_{RESET}$ falls within the second range at S441, then it is determined that reliable data is stored in the variable resistance element 10 and the method of FIG. 12 ends.

Returning to S441, if the reset current $I_{RESET}$ does not fall within the second range, then it is determined whether the reset current $I_{RESET}$ is greater than a maximum value $I_{2\_MAX}$ of the second range or less than a minimum value $I_{2\_MIN}$ of the second range.

If the reset current $I_{RESET}$ is greater than the maximum value $I_{2\_MAX}$ of the second range, then the process returns to S410 (referred to here as S443) and the reset voltage $V_{RESET}$ is applied again at S443. The process then continues as discussed above.

Returning again to S441, if the reset current $I_{RESET}$ is less than the minimum value $I_{2\_MIN}$ of the second range, then the modulated set voltage $V_{SET}$ obtained during the modulating of the set voltage $V_{SET}$ at S430 is applied to the variable resistance element 10 at S445. The process then returns to S410 (S443) and continues as discussed above.

According to at least this example embodiment, when the reset current $I_{RESET}$ is less than the minimum value $I_{2\_MIN}$ of the second range, it is not possible to correct data written by applying the reset voltage $V_{RESET}$ again. Thus, to write reliable data, the set voltage $V_{SET}$ may be applied to the variable resistance element 10 to return the variable resistance element 10 back to a low resistance ('ON' resistance $R_{ON}$) state, and then the reset voltage $V_{RESET}$ may be applied to the variable resistance element 10. In this case, an energy level of the variable resistance element 10 may be suppressed and/or prevented from being in the overshoot state and/or the undershoot state by modulating the set voltage $V_{SET}$ to be applied to the low resistance.

According to at least some alternative example embodiments, operations S443 and S445 may be performed based on whether the sensed reset current $I_{RESET}$ is greater than the average reset current. That is, for example, if the sensed reset current $I_{RESET}$ is greater than the average reset current, then the applying of the reset voltage $V_{RESET}$ again is performed at S443. If the sensed reset current $I_{RESET}$ is less than the average reset current, then the applying of the modulated set voltage $V_{SET}$ is performed at S445.

Figure 13:
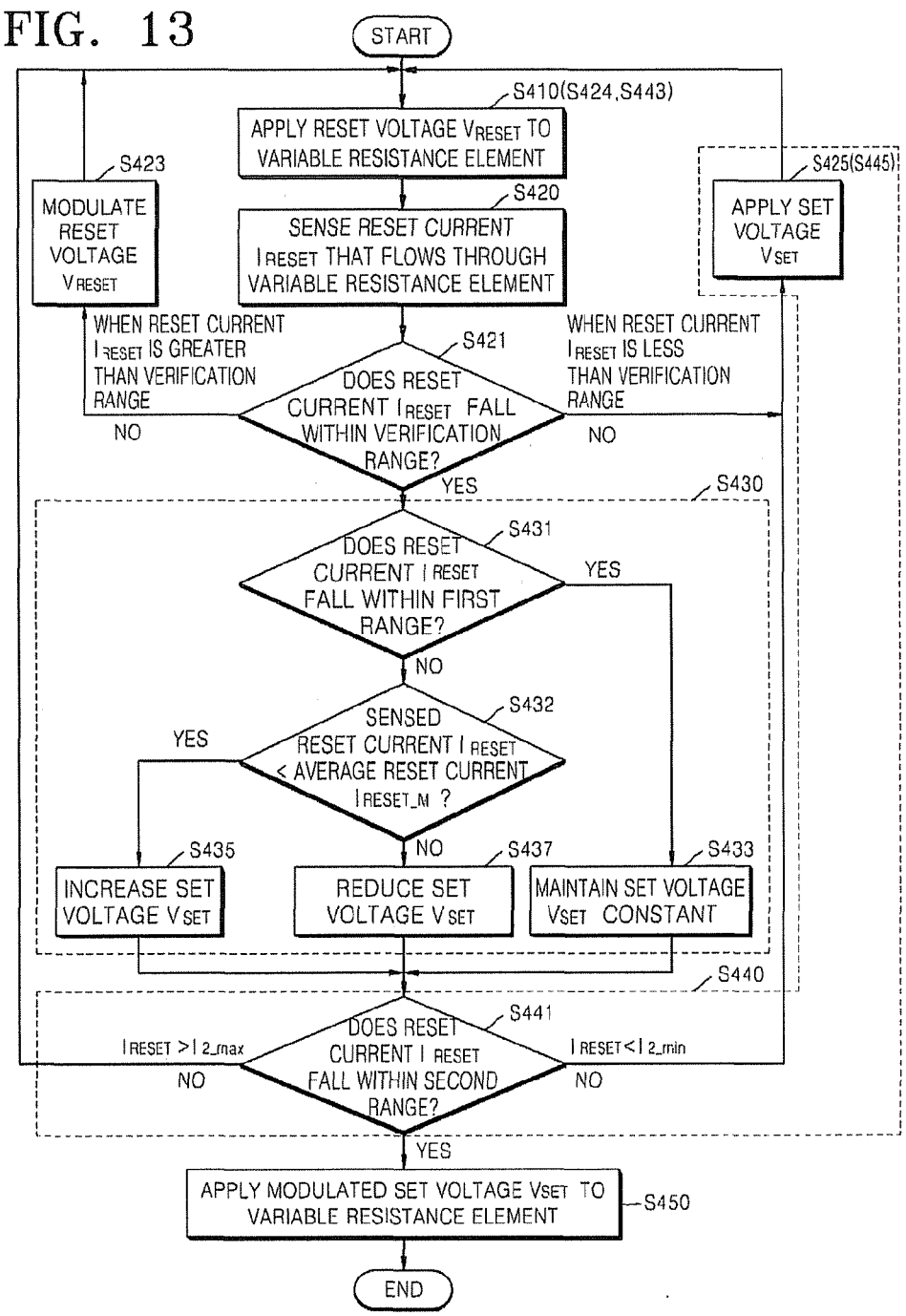
FIG. 13 is a flowchart illustrating an example embodiment of a method of operating a semiconductor device.

FIG. 13 is a flowchart illustrating a method of operating a semiconductor device according to another example embodiment. The method of FIG. 13 is similar to the method of FIG. 12. Parts of the method of FIG. 13 that are the same or substantially the same as those of the method of FIG. 12 will not be described in detail again here. As with FIG. 12, for example purposes, the method shown in FIG. 13 will be described with regard to the variable resistance element shown in FIG. 1.

Referring to FIG. 13, at S410 a reset voltage $V_{RESET}$ is applied to the variable resistance element 10 of FIG. 1. Then, at S420 a reset current $I_{RESET}$ that flows through the variable resistance element 10 is sensed.

At S421, it is determined whether the sensed reset current $I_{RESET}$ falls within a verification range. Operation S421 may be selectively performed when multi-level data is to be stored in the variable resistance element 10. The verification range refers to a range of current corresponding to a second resistance (reset resistance) value, and is different from dispersion ranges (e.g., a first range and a second range), which will be described below. That is, for example, the verification range may correspond to multi-level data that is to be stored (e.g., '10', '01', and '00'), and is different from dispersion ranges (e.g., the first and second ranges), which indicate the reliability of the multi-level data.

If the sensed reset current $I_{RESET}$ falls within the verification range, then a set voltage $V_{SET}$ that is to be applied to the variable resistance element 10 is modulated based on a dispersion of the reset current $I_{RESET}$ at S430. Then, at S440 the reset voltage $V_{RESET}$ is applied again to the variable resistance element 10 based on a dispersion of the reset current $I_{RESET}$.

Returning to S421, if the sensed reset current $I_{RESET}$ does not fall within the verification range, then it is determined whether the reset current $I_{RESET}$ is greater than or less than the verification range.

If the reset current $I_{RESET}$ is greater than the verification range (e.g., a maximum value of the verification range), then the reset voltage $V_{RESET}$ is applied again to the variable resistance element 10 at S424. Operation S424 is different from operation S443 in which the reset voltage $V_{RESET}$ is applied again to the variable resistance element 10 based on the dispersion of the reset current $I_{RESET}$. In this regard, the reset current $I_{RESET}$ is modulated to fall within a dispersion range thereof at S443, whereas the reset current $I_{RESET}$ is modulated to correspond to a level of multi-level data at S424. Thus, before operation S424 is performed, the reset voltage $V_{RESET}$ may be changed (e.g., the reset voltage $V_{RESET}$ may be increased) at S423.

If the reset current $I_{RESET}$ is less than the verification range (e.g., a minimum value of the verification range), then a voltage (e.g., the set voltage $V_{SET}$) is applied to the variable resistance element 10 at S425. The set voltage $V_{SET}$ may be applied at S425 to rewrite data by returning the variable resistance element 10 back to a low resistance ('ON' resistance $R_{ON}$) state. The reset voltage $V_{RESET}$ may then be applied to the variable resistance element 10 at S424.

Returning to S430, it is determined whether the reset current $I_{RESET}$ falls within the first range at S431.

If the reset current $I_{RESET}$ falls within the first range, then the set voltage $V_{SET}$ is maintained constant or substantially constant at S433.

Returning to S431, if the reset current $I_{RESET}$ does not fall within the first range, it is determined whether the sensed reset current $I_{RESET}$ is less than an average reset current at S432.

When the sensed reset current $I_{RESET}$ is less than the average reset current at S432, then the variable resistance element 10 is in the undershoot state, and the set voltage $V_{SET}$ is increased at S435. If the sensed reset current $I_{RESET}$ is not less than the average reset current (e.g., the sensed reset current $I_{RESET}$ is greater than the average reset current) at S432, then the variable resistance element 10 is in the overshoot state, and the set voltage $V_{SET}$ is reduced at S437.

With regard to the applying of the reset voltage $V_{RESET}$ again at S440, it is determined whether the reset current $I_{RESET}$ falls within the second range at S441.

If the reset current $I_{RESET}$ falls within the second range, then it is determined that reliable data is stored in the variable resistance element 10 and the method of FIG. 13 ends. According to at least one example embodiment, the set voltage $V_{SET}$ may be applied to the variable resistance element 10 at S450. The set voltage $V_{SET}$ applied at S450 may be the modulated set voltage $V_{SET}$. Operation S450 may be performed during erasing of data from the variable resistance element 10. According to at least some example embodiments, however, operation S450 may be omitted.

Returning to S441, if the reset current $I_{RESET}$ does not fall within the second range, then it is determined whether the reset current $I_{RESET}$ is greater than a maximum value $I_{2\_MAX}$ of the second range or less than a minimum value $I_{2\_MIN}$ of the second range. Then, as described above, the reset voltage $V_{RESET}$ is applied again at S443 or the modulated set voltage $V_{SET}$ is applied at S445 based on whether the reset current $I_{RESET}$ is greater than the maximum value $I_{2\_MAX}$ or less than a minimum value $I_{2\_MIN}$.

FIG. 14 is a table illustrating example operations that are repeatedly performed according to the method of FIG. 13.

Referring to FIG. 14, if reset current $I_{RESET}$ does not fall within any of a first range and a second range and is greater than a maximum value of the first range and a maximum value of the second range, then operations S410 and S431 are performed and operation S437 is performed to reduce a set voltage $V_{SET}$. Also, operation S443 is performed to apply a reset voltage $V_{RESET}$ again. Thus, a dispersion of resistance values of a variable resistance element that is in a low resistance (overshoot) state may be improved. Optionally, operation S450 may be performed to apply the reduced (modulated) set voltage $V_{SET}$ to the variable resistance element.

If the reset current $I_{RESET}$ falls within both the first range and the second range, then operations S410 and S431 are performed, and operation S433 is performed to maintain the set voltage $V_{SET}$ constant or substantially constant. In this case, because the reliability of data stored in the variable resistance element is secured, the method of FIG. 13 ends. Optionally, operation S450 may be performed to apply the original (non-modulated) set voltage $V_{SET}$ to the variable resistance element.

If the reset current $I_{RESET}$ does not fall within any of the first range and the second range and is less than a minimum value of the first range and a minimum value of the second range, then operations S410 and S431 are performed, and operation S435 is performed to increase the set voltage $V_{SET}$. Then, operation S445 is performed to apply the modulated set voltage modulated $V_{SET}$, and operation S443 is performed to apply the reset voltage $V_{RESET}$ again. Thus, a dispersion of resistance values of the variable resistance element that is in a high resistance (undershoot) state may be improved.

Optionally, operation S450 may be performed to apply the increased (modulated) set voltage $V_{SET}$ to the variable resistance element.

Figure 15:
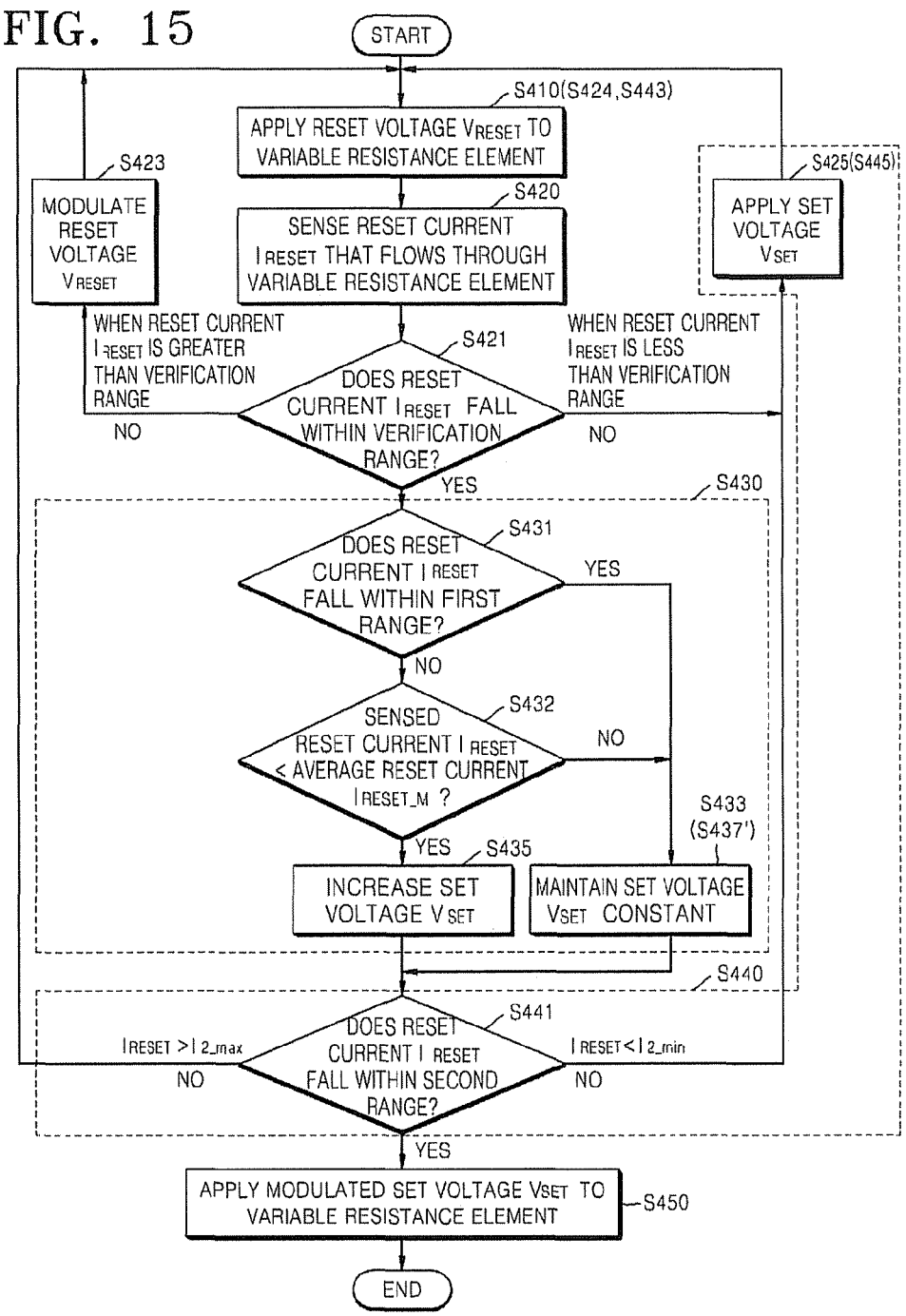
FIG. 15 is a flowchart illustrating an example embodiment of a method of operating a semiconductor device.

FIG. 15 is a flowchart illustrating a method of operating a semiconductor device according to another example embodiment. The method of FIG. 15 is similar to the method of FIG. 13. Parts of the method of FIG. 15 that are the same or substantially the same as those of the method of FIG. 13 will not be described in detail again here. As with FIG. 13, the method shown in FIG. 15 will be described with regard to the variable resistance element shown in FIG. 1.

Referring to FIG. 15, at S410 a reset voltage $V_{RESET}$ is applied to the variable resistance element 10 of FIG. 1. Then, at S420 a reset current $I_{RESET}$ that flows through the variable resistance element 10 is sensed.

At S421, it is determined whether the sensed reset current $I_{RESET}$ falls within a verification range. If the sensed reset current $I_{RESET}$ does not fall within the verification range, then the method proceeds as discussed above with regard to FIG. 13.

Returning to S421, if the sensed reset current $I_{RESET}$ falls within the verification range, then a set voltage $V_{SET}$ is modulated at S430.

In more detail, at S430, it is determined whether the reset current $I_{RESET}$ falls within a first range at S431. If the reset current $I_{RESET}$ falls within the first range, then the set voltage $V_{SET}$ is maintained constant or substantially constant at S433, as described above.

Returning to S431, if the reset current $I_{RESET}$ does not fall within the first range, it is determined whether the sensed reset current $I_{RESET}$ is less than an average of the reset current $I_{RESET}$ at S432. Alternatively, at S432, it may be determined whether the reset current $I_{RESET}$ is less than a minimum value $I_{1\_MIN}$ of the first range.

If the sensed reset current $I_{RESET}$ is less than the average of the reset current $I_{RESET}$ (e.g., the reset current $I_{RESET}$ is less than the minimum value $I_{1\_MIN}$ of the first range), then the set voltage $V_{SET}$ is increased at S435. On the other hand (e.g., if the sensed reset current $I_{RESET}$ is greater than the average of the reset current $I_{RESET}$ at S432), then the set voltage $V_{SET}$ is maintained constant or substantially constant at S433.

If the sensed reset current $I_{RESET}$ is greater than the average of the reset current $I_{RESET}$ (e.g., in the overshoot state), then the set voltage $V_{SET}$ is not reduced and is maintained constant or substantially constant at S437', unlike in the method of FIG. 13.

In the case of a variable resistance element including tantalum oxide (TaO) (e.g., the variable resistance element 10' of FIG. 2), the variable resistance element may show a more uniform distribution of set voltages even when a relatively high level (e.g., an excessively high level) of energy is applied to the variable resistance element (see, e.g., FIG. 6). Such a function of the variable resistance element may be referred to as a self-compliance function.

If the original (non-modulated) set voltage $V_{SET}$ is applied to the variable resistance element that is in the overshoot state, as at S437', then the set voltage $V_{SET}$ applied thereto may be relatively high (e.g., excessively high), and thus, the variable resistance value may have a relatively wide dispersion of resistance values. However, if the variable resistance element has the self-compliance function, then the set voltage $V_{SET}$ may be maintained constant or substantially constant even when the set voltage $V_{SET}$ having a relatively high (e.g., an excessively high) energy level is applied thereto. Accordingly, even if the set voltage $V_{SET}$ that is maintained constant or substantially constant is applied to the variable resistance element, as at S437', the variable resistance element may show a more uniform distribution of resistance values.

FIG. 16 is a table illustrating operations that are repeatedly performed according to the method of FIG. 15.

Referring to FIG. 16, if the reset current $I_{RESET}$ does not fall within any of a first range and a second range (e.g., in a low resistance state), then operations S410, S431, and S432 are performed.

If the reset current $I_{RESET}$ is greater than maximum values of the first and second ranges, then the set voltage $V_{SET}$ is maintained constant or substantially constant at S437'. Thus, operation S450 may be performed to apply the original (non-modulated) set voltage $V_{SET}$ to a variable resistance element.

If the reset current $I_{RESET}$ falls within both the first range and the second range, then operations S410 and S431 are performed, and operation S433 is performed to maintain the set voltage $V_{SET}$ constant or substantially constant. Because the reliability of data stored in the variable resistance element is secured, the method of FIG. 15 ends. Optionally, at S450 may be performed to apply the original (non-modulated) set voltage $V_{SET}$ to the variable resistance element.

Figure 17:
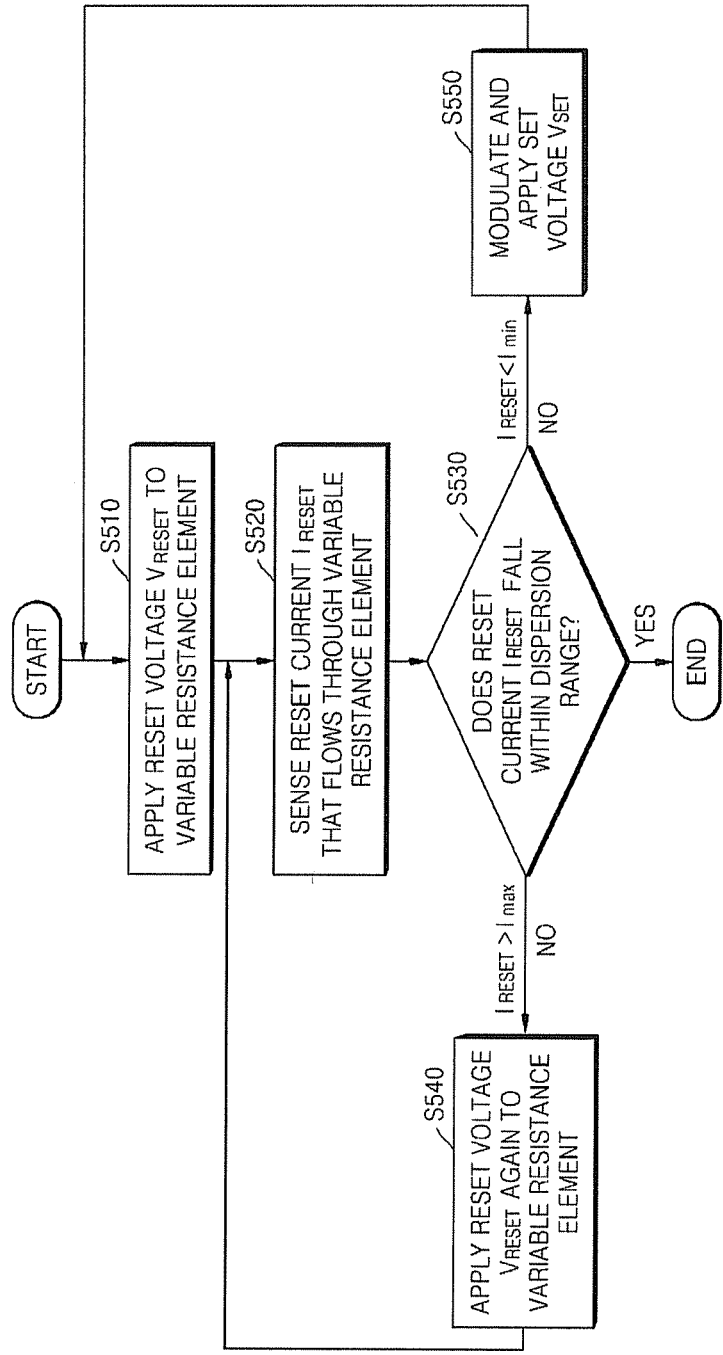
FIGS. 17 and 18 are flowcharts schematically illustrating example embodiments of methods of operating semiconductor devices.
Figure 18:
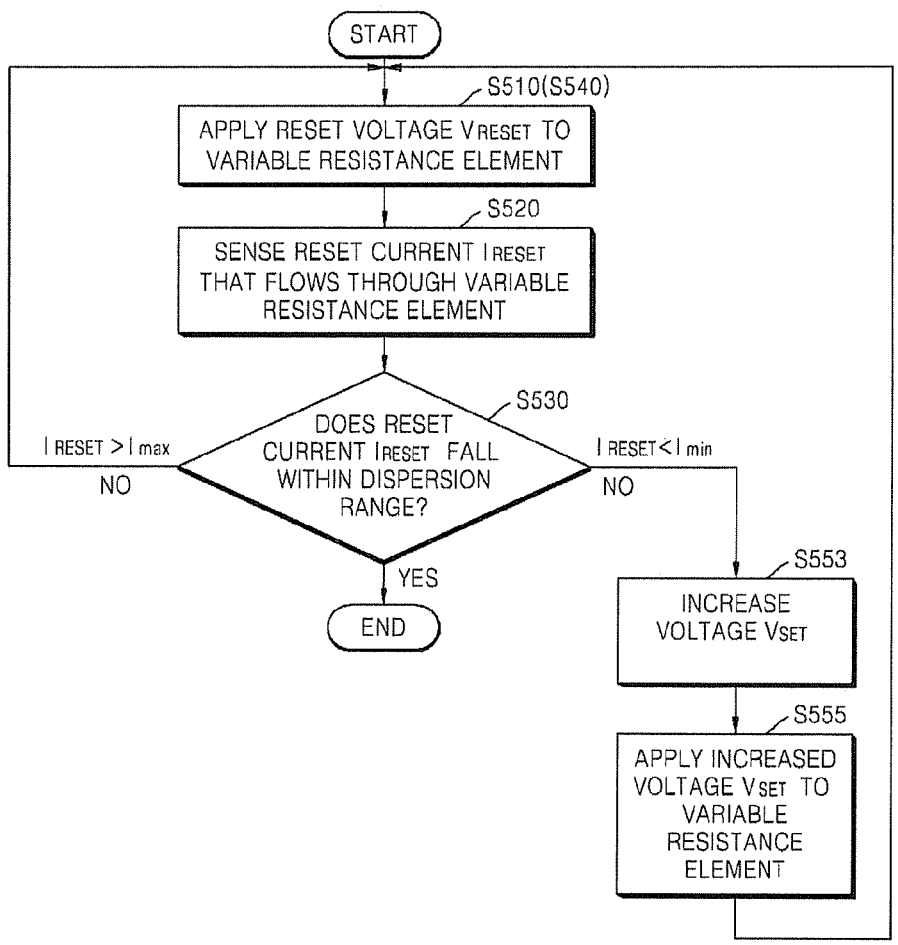

FIGS. 17 and 18 are flowcharts schematically illustrating methods of operating a semiconductor device, according to other example embodiments. The methods of FIGS. 17 and 18 are similar to the method of FIG. 13. Thus, parts of the methods of FIGS. 17 and 18 that are the same or substantially the same as those of the method of FIG. 13 will not be described in detail again here.

The methods of FIGS. 17 and 18 are similar to the method of FIG. 13 on an assumption that a first range and a second range are the same or substantially the same (e.g., identical).

Referring to FIGS. 17 and 18, at S510 a reset voltage $V_{RESET}$ is applied to the variable resistance element 10 of FIG. 1. Then, at S520 a reset current $I_{RESET}$ that flows through the variable resistance element 10 is sensed.

At S530, it is determined whether the reset current $I_{RESET}$ falls within a dispersion range. The dispersion range may correspond to the first range and the second range described above. In other words, the dispersion range may have the same or substantially the same value as the first range and the second range in the example embodiments discussed above.

If the reset current $I_{RESET}$ falls within a dispersion range, then the method ends.

Returning to S530, if the reset current $I_{RESET}$ does not fall within the dispersion range, then it is determined whether the reset current $I_{RESET}$ is greater than a maximum value $I_{MAX}$ of the dispersion range or is less than a minimum value $I_{MIN}$ of the dispersion range.

If the reset current $I_{RESET}$ is greater than the maximum value $I_{MAX}$ of the dispersion range, then the reset voltage $V_{RESET}$ is applied again to the variable resistance element 10 at S540.

Returning to S530, if a dispersion of resistance values of the variable resistance element 10 does not fall within the dispersion range and the sensed reset current $I_{RESET}$ is greater than an average of the reset current $I_{RESET}$, then the reset voltage $V_{RESET}$ may be applied again to the variable resistance element 10 to improve the dispersion of the resistance values of the variable resistance element 10, as described above.

If the reset current $I_{RESET}$ is less than the minimum value $I_{MIN}$ of the dispersion range, then the set voltage $V_{SET}$ is modulated and applied at S550. An example embodiment of operation S550 is illustrated in more detail in FIG. 18.

Referring to FIG. 18, the modulating and applying of the set voltage $V_{SET}$ at S550 may include modulating the set voltage $V_{SET}$ to be increased at S553 and applying the modulated (increased) set voltage $V_{SET}$ to the variable resistance element 10 at S555.

If a dispersion of resistance values of the variable resistance element 10 does not fall within the dispersion range and the sensed reset current $I_{RESET}$ is less than an average of the reset current $I_{RESET}$, then the dispersion of resistance values of the variable resistance element 10 may be improved by applying the modulated (increased) set voltage $V_{SET}$ to the variable resistance element 10 as described above.

Figure 19:
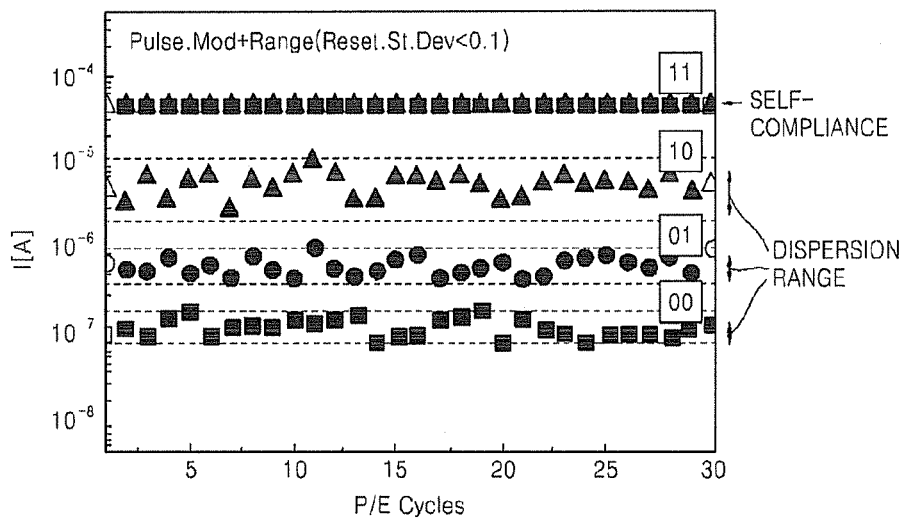
FIG. 19 is a graph showing example experimental results that measure reset current when a method of operating a semiconductor device according to an example embodiment was performed several times.

FIG. 19 is a graph showing experimental results when measuring reset current $I_{RESET}$ when a method of operating a semiconductor device according to an example embodiment was performed several times. The experimental results shown in FIG. 19 reveal that the reset current $I_{RESET}$ that flows through a variable resistance element fell within a dispersion range when: (i) a modulated set voltage modulated $V_{SET}$ and a reset voltage $V_{RESET}$ were applied to the variable resistance element and (ii) the reset voltage $V_{RESET}$ was repeatedly applied to the variable resistance element until a dispersion of resistance values of the variable resistance element fell within a dispersion range, as described above with respect to example embodiments.

Figure 20:
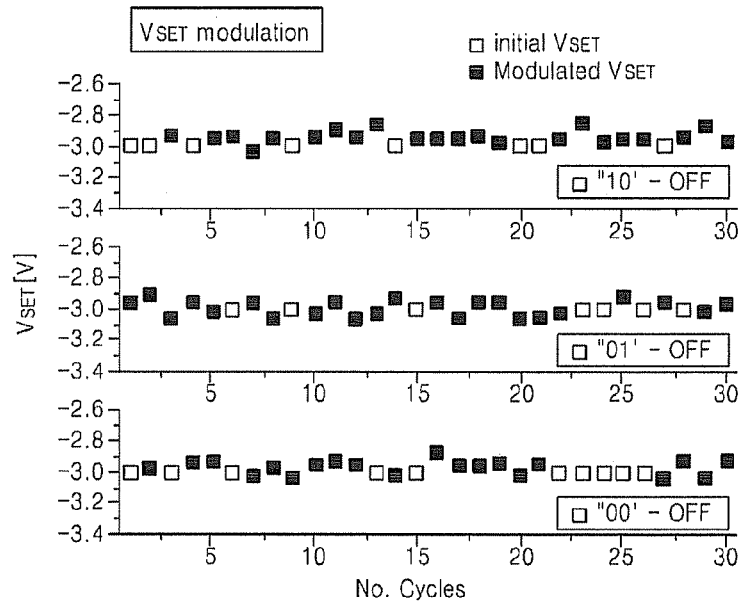
FIG. 20 is a graph showing example experimental results that measure a variation in a set voltage modulated when a method of operating a semiconductor device according to an example embodiment was performed several times.
Figure 21:
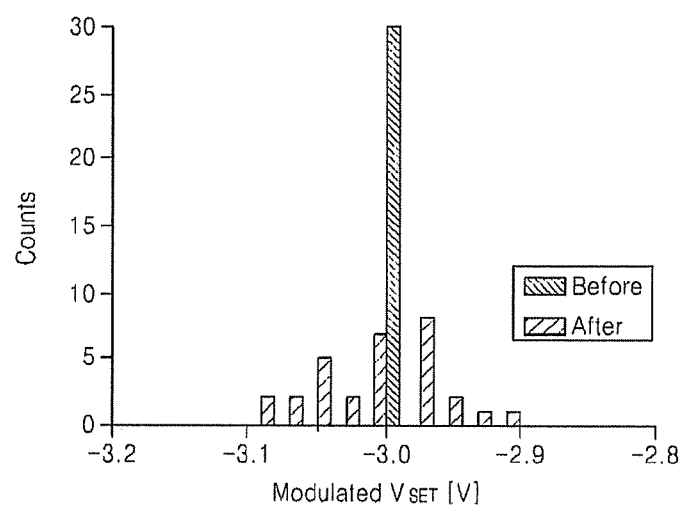
FIG. 21 is a graph showing example experimental results that measure a distribution of the modulated set voltage of FIG. 20.

FIG. 20 is a graph showing experimental results when measuring a variation in a set voltage $V_{SET}$ modulated when a method of operating a semiconductor device according to an example embodiment was performed several times. FIG. 21 is a graph showing experimental results when measuring a distribution of the modulated set voltage $V_{SET}$ of FIG. 20.

Referring to FIG. 20, the set voltage $V_{SET}$ was modulated based on whether reset current $I_{RESET}$ falls within a first range. For example, if a variable resistance element was programmed to have an 'OFF' resistance value corresponding to data '00', then in a first program cycle, the reset current $I_{RESET}$ that flows through the variable resistance element fell within the first range and the set voltage $V_{SET}$ was thus maintained constant or substantially constant at about −3.0 V. However, because in a second program cycle, the reset current $I_{RESET}$ that flows through the variable resistance element did not fall within the first range and the sensed reset current $I_{RESET}$ was less than an average thereof, the set voltage $V_{SET}$ was increased to about −2.95 V.

Referring to FIG. 21, according to a conventional method of operating a semiconductor device, a set voltage $V_{SET}$ applied to a variable resistance element was maintained constant at about −3.0 V. On the other hand, according to a method of operating a semiconductor device according to an example embodiment, a set voltage $V_{SET}$ was modulated between about −3.1 V and about −2.9 V, and the modulated set voltage was then applied to a variable resistance element. Thus, a dispersion of resistance values of the variable resistance element may be improved by applying the modulated set voltage $V_{SET}$, and power consumption may be reduced because the set voltage $V_{SET}$ has a more even distribution.

Figure 22:
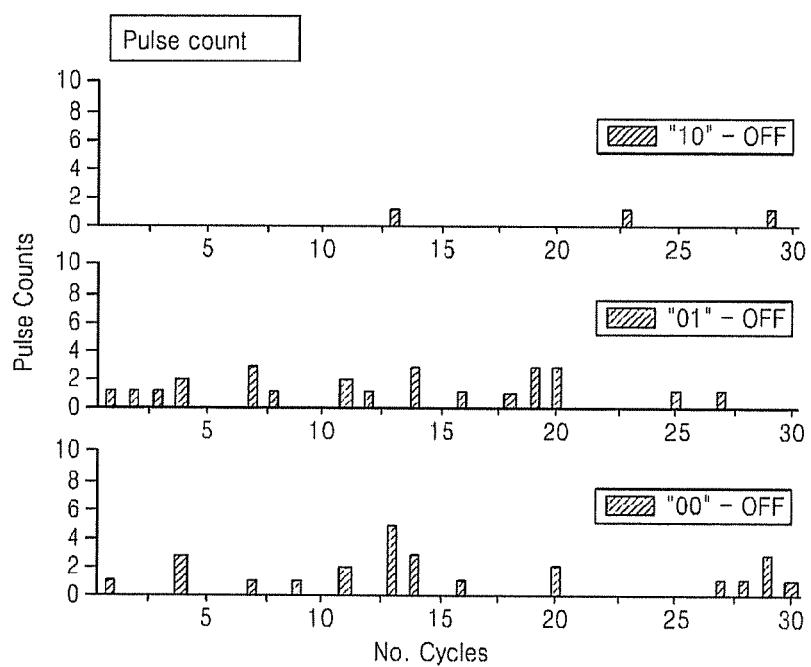
FIG. 22 is a graph showing example experimental results that measure a number of times that a reset voltage was repeatedly applied to a variable resistance element while performing a method of operating a semiconductor device according to an example embodiment several times.

FIG. 22 is a graph showing experimental results for an experiment that measures the number of times that a reset voltage $V_{RESET}$ was repeatedly applied to a variable resistance element while performing a method of operating a semiconductor device according to an example embodiment several times.

Referring to FIG. 22, the reset voltage $V_{RESET}$ was applied again to the variable resistance element, based on whether reset current $I_{RESET}$ fell within a second range. For example, when the variable resistance element was programmed to have an 'OFF' resistance value corresponding to a '00' state, in a first program cycle, the reset current $I_{RESET}$ that flows through the variable resistance element did not fall within the second range, and thus, the reset voltage $V_{RESET}$ was applied once more. On the other hand, because in a second program cycle, the reset current $I_{RESET}$ that flows through the variable resistance element fell within the second range, the reset voltage $V_{RESET}$ was not applied again and the programming ends.

The experimental results shown in FIG. 22 reveal that the reset voltage $V_{RESET}$ was applied more times when the variable resistance element was programmed to a '01' or '00' state than when the variable resistance element was programmed to a '10' state. This is because the '01' or '00' state is much further from an 'ON' cell state (e.g., a '11' state) than the '10' state. Thus, either a higher voltage should be applied in the '01' or '00' state or a voltage should be applied in the '01' or '00' state for a longer time than in the '11' state. Thus, a voltage applied to the variable resistance element is relatively high to increase a dispersion of resistance values of the variable resistance element.

However, according to at least some example embodiments, even if the variable resistance element is programmed to the '01' or '00' state, the dispersion of resistance values of the variable resistance element may be improved by repeatedly applying the reset voltage $V_{RESET}$ to the variable resistance element.

When methods of operating a semiconductor device according to at least some example embodiments are used, the dispersion of resistance values of the variable resistance element may be further improved, for example, when multi-level data is written to the semiconductor device.

Figure 23:
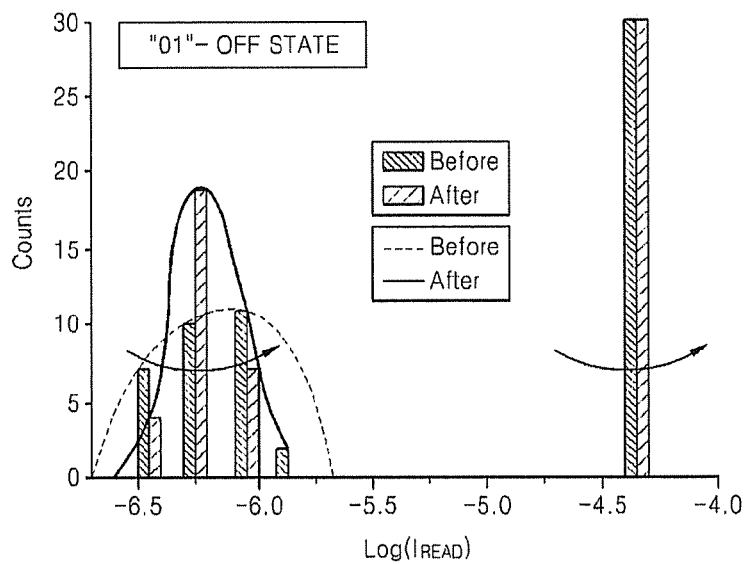
FIG. 23 is a graph showing example experimental results that repeatedly measure reset current that flows through a variable resistance device while performing a method of operating a semiconductor device according to an example embodiment several times.

FIG. 23 is a graph showing experimental results for an experiment that repeatedly measures reset current $I_{RESET}$ that flows through a variable resistance device while performing a method of operating a semiconductor device according to an example embodiment several times.

Referring to FIG. 23, when a conventional method of operating a semiconductor device was used, reset current $I_{RESET}$ that flows through a variable resistance element had a distribution of between about 1.00E-6.5 and about 1.00E-5.8, inclusive, and had a relatively wide dispersion. However, when a method of operating a semiconductor device according to at least one example embodiment was used, reset current $I_{RESET}$ that flows through a variable resistance element had a distribution of between about 1.00E-6.5 and about 1.00E-6.0, inclusive, and thus had a relatively narrow dispersion. Accordingly, a dispersion of resistance values of a variable resistance element was improved when a method of operating a semiconductor device according to at least some example embodiments is employed.

Figure 24:
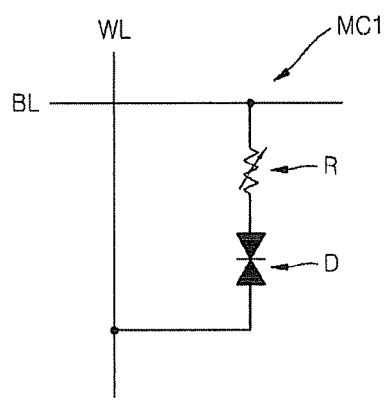
FIG. 24 is a circuit diagram of a semiconductor device including a variable resistance element according to an example embodiment.

FIG. 24 is a circuit diagram of a semiconductor device including a variable resistance element, according to an example embodiment.

Referring to FIG. 24, the semiconductor device may be, for example, a non-volatile memory device, in which at least one unit cell MC1 includes a variable resistor R and a diode D. Here, the variable resistor R may be the same or substantially the same as the variable resistance element 10 of FIG. 1 or the variable resistance element 10' of FIG. 2. A first terminal and second terminal of the variable resistor R are connected to a bit line BL and the diode D, respectively. The diode D is configured to operate in opposite directions, and select the at least one unit cell MC1 based on a voltage applied to a word line WL.

If the semiconductor device is a single-bit non-volatile memory device, then when a reset voltage is applied to the variable resistor R, the variable resistor R changes from a low resistance state to a high resistance state and data '0' is written to the semiconductor device. When a set voltage is applied to the variable resistor R, the variable resistor R changes from the high resistance state to the low resistance state and data '1' is written to the semiconductor device. In this case, to write data '0' to the semiconductor device, the reset voltage may be repeatedly applied to the variable resistor R until current that flows through the variable resistor R falls within a given, desired or predetermined current range.

If the semiconductor device is a multi-bit non-volatile memory device, then when a first reset voltage is applied to the variable resistor R, the variable resistor R changes from the low resistance state to a first high resistance and data '01' is written to the semiconductor device. When a second reset voltage that is higher than the first reset voltage is applied to the variable resistor R, the variable resistor R changes to a second high resistance and data '10' is written to the semiconductor device. When a third reset voltage that is higher than the second reset voltage is applied to the variable resistor R, the variable resistor R changes to a third high resistance and data '00' is written to the semiconductor device. When the set voltage is applied to the variable resistor R, the variable resistor R changes to the low resistance and data '11' is written to the semiconductor device.

In order to write data '01' to the semiconductor device, the first reset voltage may be repeatedly applied to the variable resistor R until current that flows through the variable resistor R to which the first reset voltage is applied falls within a first current range. In order to write data '10' to the semiconductor device, the second reset voltage may be repeatedly applied to the variable resistor R until current that flows through the variable resistor R to which the second reset voltage is applied falls within the first current range. In order to write data '00' to the semiconductor device, the third reset voltage may be repeatedly applied to the variable resistor R until current that flows through the variable resistor R to which the third reset voltage is applied falls within the first range of current.

Figure 25:
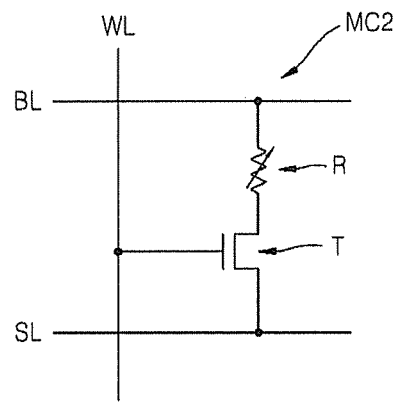
FIG. 25 is a circuit diagram of a semiconductor device including a variable resistance element according to another example embodiment.

FIG. 25 is a circuit diagram of a semiconductor device including a variable resistance element, according to another example embodiment.

Referring to FIG. 25, the semiconductor device may be, for example, a non-volatile memory device, in which at least one unit cell MC2 includes a variable resistor R and an access transistor T. Here, the variable resistor R may be substantially the same as the variable resistance element 10 of FIG. 1 or the variable resistance element 10' of FIG. 2. A first terminal and second terminal of the variable resistor R are connected to a bit line BL and the access transistor T, respectively. The access transistor T includes a gate connected to a word line WL, a drain connected to the first terminal of the variable resistor R, and a source connected to a source line SL. The access transistor T is turned 'ON' or 'OFF' to select one of the at least one unit cell MC1 based on a voltage applied to the word line WL.

If the semiconductor device is a single-bit non-volatile memory device, then when a reset voltage is applied to the variable resistor R, the variable resistor R changes from a low resistance state to a high resistance state and data '0' is written to the semiconductor device. When a set voltage is applied to the variable resistor R, the variable resistor R changes from the high resistance state to the low resistance state and data '1' is written to the semiconductor device. In this case, in order to write data '0' to the semiconductor device, the reset voltage may be repeatedly applied to the variable resistor R until current that flows through the variable resistor R falls within a given, desired or predetermined current range.

If the semiconductor device is a multi-bit non-volatile memory device, then when a first reset voltage is applied to the variable resistor R, the variable resistor R changes from the low resistance state to a first high resistance and data '01' is written to the semiconductor device. When a second reset voltage that is higher than the first reset voltage is applied to the variable resistor R, the variable resistor R changes to a second high resistance and data '10' is written to the semiconductor device. When a third reset voltage that is higher than the second reset voltage is applied to the variable resistor R, the variable resistor R changes to a third high resistance and data '00' is written to the semiconductor device. When the set voltage is applied to the variable resistor R, the variable resistor R changes to the low resistance and data '11' is written to the semiconductor device.

In order to write data '01' to the semiconductor device, the first reset voltage may be repeatedly applied to the variable resistor R until current that flows through the variable resistor R to which the first reset voltage is applied falls within a first current range. In order to write data '10' to the semiconductor device, the second reset voltage may be repeatedly applied to the variable resistor R until current that flows through the variable resistor R to which the second reset voltage is applied falls within the first current range. In order to write data '00' to the semiconductor device, the third reset voltage may be repeatedly applied to the variable resistor R until current that flows through the variable resistor R to which the third reset voltage is applied falls within the first current range.

Figure 26:
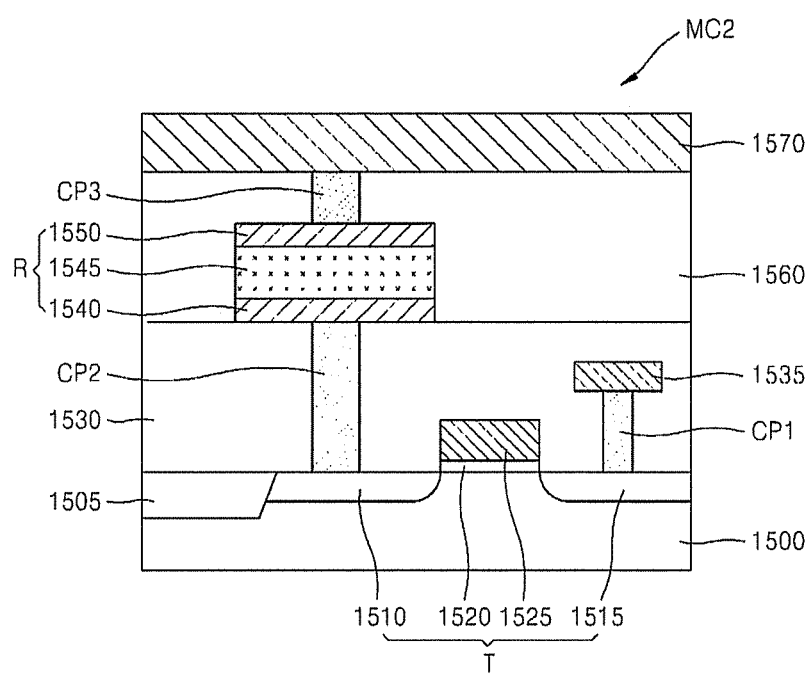
FIG. 26 is a cross-sectional view of an example of the semiconductor device illustrated in FIG. 25.

FIG. 26 is a cross-sectional view of an example of the semiconductor device illustrated in FIG. 25.

Referring to FIG. 26, an isolation layer 1505 is formed in a given, desired or predetermined region of a semiconductor substrate 1500 to define an active area or region. A drain region 1510 and a source region 1515 are disposed apart from each other in the active area. A gate insulating layer 1520 is disposed in the active area between the drain region 1510 and the source region 1515. A gate electrode 1525 is disposed on the gate insulating layer 1520. In this case, the gate electrode 1525 may extend to function as the word line WL or to be connected to the word line WL. The gate electrode 1525, the drain region 1510, and the source region 1515 form the access transistor T.

A first interlayer insulating layer 1530 is formed on the access transistor T, and a first contact plug CP1 and a second contact plug CP2 are formed in the first interlayer insulating layer 1530. The source region 1515 is connected to the source line SL via the first contact plug CP1, and the drain region 1510 is connected to a lower electrode 1540 via the second contact plug CP2.

A second interlayer insulating layer 1560 is formed on the first interlayer insulating layer 1530. The lower electrode 1540, a variable resistance material layer 1545, and an upper electrode 1550 are sequentially formed in a region of the second interlayer insulating layer 1560. The upper electrode 1550 is connected to a bit line 1570 via a third contact plug CP3. The lower electrode 1540, the variable resistance material layer 1545, and the upper electrode 1550 form the variable resistor R together. The variable resistor R corresponds to the variable resistance element 10 of FIG. 1.

The access transistor T and the diode D of FIG. 24 are selectors (or selection circuit) and connected in series with the variable resistor R. A controller (not shown) included in the semiconductor device controls the selectors to apply a voltage to the variable resistor R. In this case, the controller controls the selectors based on any of the methods of operating a semiconductor device according to one or more example embodiments described herein.

Cases where a variable resistance element according to an example embodiment is included in a semiconductor device, for example, a single-bit non-volatile memory device or a multi-bit non-volatile memory device, have been described herein. However, a variable resistance element according to an example embodiment may be included in a logic gate and be employed in a logic circuit, thereby reducing an area of the logic circuit and improving an integration degree of the logic circuit. More specifically, variable resistance elements according to at least some example embodiments may be employed in a memristor. In this case, a method of operating the memristor may be the same or substantially the same as any of methods of operating a semiconductor device according to example embodiments described herein. Here, a memristor is a device capable of storing a direction and amount of current and changing a resistance value thereof based on the stored direction and amount of current.

Figure 27:
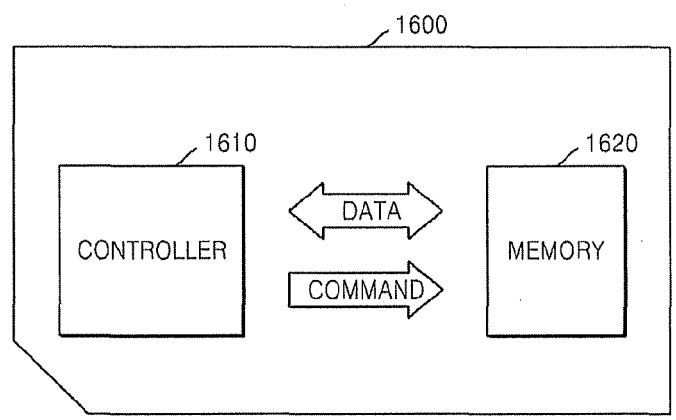
FIG. 27 is a schematic block diagram of a memory card according to an example embodiment.

FIG. 27 is a schematic block diagram of a memory card 1600 according to an example embodiment.

Referring to FIG. 27, the memory card 1600 includes a controller 1610 and a memory 1620. The controller 1610 and the memory 1620 are configured to exchange electronic signals with each other. For example, if the controller 1610 provides a command to the memory 1620, then the memory 1620 may transmit data to the controller 1610. The memory 1620 may include a non-volatile memory device including a variable resistance element according to any of the above-discussed example embodiments.

The memory card 1600 may be employed in various types of memory devices, for example, a memory stick card, a smart media card (SM), a secure digital (SD) card, a mini SD card, a multimedia card (MMC), etc.

Figure 28:
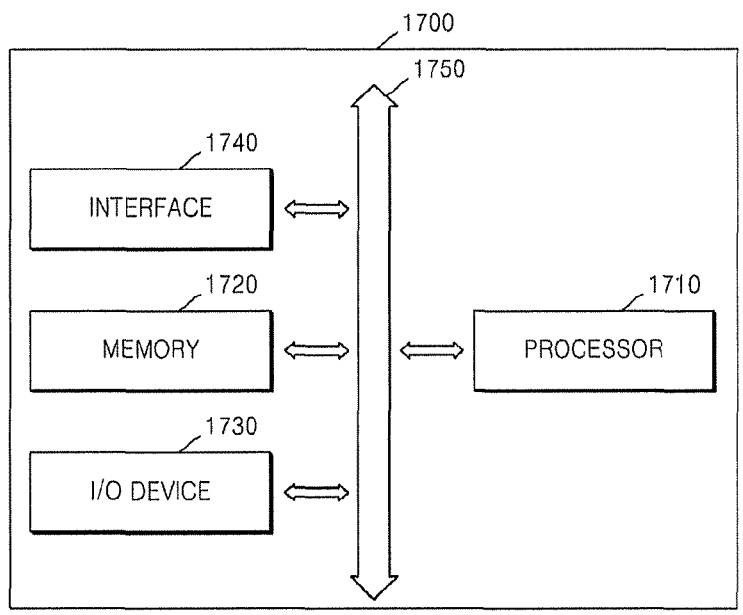
FIG. 28 is a schematic block diagram of an electronic system according to an example embodiment.

FIG. 28 is a schematic block diagram of an electronic system 1700 according to an example embodiment.

Referring to FIG. 28, the electronic system 1700 includes a processor 1710, a memory 1720, an input/output (I/O) device 1730, and an interface unit 1740. The electronic system 1700 may be a mobile system or a system that transmits or receives information. The mobile system may be a personal digital assistant (PDA), a portable computer, a web tablet, a wireless phone, a mobile phone, a digital music player, a memory card, etc.

The processor 1710 is configured to run a program and control the electronic system 1700. The processor 1710 may be, for example, a microprocessor, digital signal processor, a microcontroller, or the like.

The I/O device 1730 is configured to be used to input data to or output data from the electronic system 1700. The electronic system 1700 may be connected to an external device (e.g., a personal computer or a network) via the I/O device 1730 so as to exchange data with the external device. The I/O device 1730 may be, for example, a keypad, a keyboard, a display, or combination thereof.

The memory 1720 is configured to store code and/or data for operating the processor 1710, and/or store data processed by the processor 1710. The memory 1720 may include a non-volatile memory device including a variable resistance element according to any of the above-described example embodiments.

The interface unit 1740 may be used as a data transmission path between the electronic system 1700 and an external device. The processor 1710, the memory 1730, the I/O device 1730, and the interface unit 1740 are configured to communicate with one another via a bus 1750.

For example, the electronic system 1700 may be employed in a mobile phone, an MP3 player, a navigation, a portable multimedia player (PMP), a solid state drive (SSD), household appliances, etc.

According to the one or more example embodiments, in order to write data corresponding to an 'OFF' state to a semiconductor device, the same or substantially the same reset voltage is repeatedly applied to (or different reset voltages having the same or substantially the same pulse width are sequentially applied to) a variable resistance element included in the semiconductor device until reset current that flows through the variable resistance element to which the reset voltage is applied falls within a given, desired or predetermined current range. Accordingly, a dispersion of 'OFF' current that flows through the semiconductor device may be improved (e.g., greatly improved), thereby improving the reliability of the semiconductor device.

Also, according to the one or more example embodiments, a set voltage of a variable resistance element included in a semiconductor device is modulated based on a dispersion of reset current that flows through the variable resistance element (e.g., a dispersion of 'OFF' resistance values of the variable resistance element). Thus, a dispersion of 'OFF' current that flows through the variable resistance element may be improved, thereby improving the reliability of the semiconductor device.

Furthermore, according to the one or more example embodiments, optionally, a CSPP method may be performed to repeatedly apply a reset voltage, or a set voltage of a variable resistance element may be modulated and the modulated set voltage and the reset voltage may be applied again, based on a dispersion of 'OFF' resistance values of a variable resistance element. Accordingly, a dispersion of 'OFF' resistance values of the variable resistance element may be improved, thereby improving the reliability of the semiconductor device.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A method of operating a semiconductor device including a variable resistance element, the method comprising:
    changing a resistance value of the variable resistance element from a first resistance value to a second resistance value by applying a first voltage to the variable resistance element, the first resistance value and the second resistance value being different;
    sensing a first current that flows through the variable resistance element;
    determining whether the first current is within at least one of a first range and a second range;
    modulating a second voltage for changing the resistance value of the variable resistance element from the second resistance value to the first resistance value if the first current is not within the first range; and
    re-applying the first voltage to the variable resistance element if the first current is not within the second range.

2. The method of claim 1, wherein the modulating of the second voltage comprises:
    changing at least one of an absolute value and a pulse width of the second voltage.

3. The method of claim 1, wherein the determining of whether the first current falls within the first range comprises:
    comparing the sensed first current with an average of the first current.

4. The method of claim 3, wherein the modulating of the second voltage comprises:
    increasing the second voltage when the sensed first current is lower than the average of the first current; and reducing the second voltage when the sensed first current is greater than the average of the first current.

5. The method of claim 1, wherein the modulating of the second voltage comprises:
modulating the second voltage such that a variation in the second voltage increases as a dispersion of the first current increases.

6. The method of claim 1, further comprising:
maintaining the second voltage constant or substantially constant when the first current is within the first range.

7. The method of claim 1, wherein the re-applying of the first voltage is performed when the first current is greater than a maximum value of the second range.

8. The method of claim 1, further comprising:
applying the modulated second voltage to the variable resistance element when the first current does not fall within the second range, and when the first current is less than a minimum value of the second range.

9. The method of claim 1, further comprising:
applying the modulated second voltage to the variable resistance element.

10. The method of claim 9, wherein the applying of the modulated second voltage is performed during an erase operation.

11. The method of claim 1, wherein the second resistance is greater than the first resistance.

12. The method of claim 1, wherein the first resistance is a set resistance, and the second resistance is a reset resistance.

13. The method of claim 1, wherein the sensing of the first current that flows through the variable resistance element comprises:
sensing the first current that flows through the variable resistance element by applying a read voltage, the absolute value of the read voltage being less than the first voltage.

14. The method of claim 1, further comprising:
determining, before the determining of whether the first current is within the first range, whether the first current is within a verification range that is a range of current corresponding to the second resistance value.

15. The method of claim 14, further comprising:
changing the first voltage if the first current is greater than a maximum value of the verification range.

16. The method of claim 15, wherein re-applying of the first voltage to the variable resistance element and sensing of the first current that flows through the variable resistance element are repeatedly performed.

17. The method of claim 14, further comprising:
applying, if the first current is less than a minimum value of the verification range, a third voltage to the variable resistance element to change a resistance value of the variable resistance element from the second resistance value to the first resistance value.

18. The method of claim 17, wherein applying of the first voltage to the variable resistance element and sensing of the first current that flows through the variable resistance element are repeatedly performed after the application of the third voltage.

19. A method of operating a semiconductor device including a variable resistance element, the method comprising:
changing a resistance value of the variable resistance element from a first resistance value to a second resistance value by applying a first voltage to the variable resistance element, the first resistance value and the second resistance value being different;
sensing a first current that flows through the variable resistance element;
modulating, based on a dispersion of the first current, a second voltage for changing the resistance value of the variable resistance element from the second resistance value to the first resistance value; and
re-applying the first voltage to the variable resistance element based on the dispersion of the first current.

20. A method of operating a semiconductor device including a variable resistance element, the method comprising:
changing a resistance value of the variable resistance element from a first resistance value to a second resistance value by applying a first voltage to the variable resistance element, the first resistance value and the second resistance value being different;
sensing a first current that flows through the variable resistance element;
determining whether the first current falls within a dispersion range;
increasing a second voltage for changing the resistance value of the variable resistance element from the second resistance value to the first resistance value if the first current is less than a minimum value of the dispersion range; and
re-applying the first voltage to the variable resistance element if the first current is greater than a maximum value of the dispersion range.

21. The method of claim 20, further comprising:
applying the increased second voltage to the variable resistance element.

22. The method of claim 21, further comprising:
applying the first voltage to the variable resistance element.

23. A semiconductor device comprising:
a variable resistance element configured to transition between a first resistance value and a second resistance value based on an applied voltage, the applied voltage being one of a first voltage and a second voltage, and the first resistance value and the second resistance value being different;
a selector connected in series with the variable resistance element; and
a controller configured to control the selector to selectively apply the applied voltage to the variable resistance element; wherein
if a first current through the variable resistance element is not within a first range in response to an applied read voltage, then the second voltage is modulated to change the resistance value of the variable resistance element, and
if the first current through the variable resistance element is not within a second range in response to the applied read voltage, then the first voltage is re-applied to the variable resistance element.

24. A memory card comprising:
a memory including the semiconductor device of claim 23 configured to store data; and
a controller configured to control the memory.

25. An electronic system comprising:
a processor configured to at least one of execute programs and control the electronic system; and
a memory including the semiconductor device of claim 23 configured to store at least one of code and data for operating the processor.

* * * * *